United States Patent
Chu et al.

(10) Patent No.: US 8,541,769 B2
(45) Date of Patent: Sep. 24, 2013

(54) FORMATION OF A GRAPHENE LAYER ON A LARGE SUBSTRATE

(75) Inventors: Jack O. Chu, Manhasset Hills, NY (US); Christos D. Dimitrakopoulos, Baldwin Place, NY (US); Marcus O. Freitag, Sleepy Hollow, NY (US); Alfred Grill, White Plains, NY (US); Timothy J. McArdle, Mahopac, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 12/942,490

(22) Filed: Nov. 9, 2010

(65) Prior Publication Data
US 2012/0112164 A1 May 10, 2012

(51) Int. Cl.
*H01L 29/12* (2006.01)

(52) U.S. Cl.
USPC .......................................................... 257/14

(58) Field of Classification Search
USPC .......... 257/14, 29, 77, 632, E21.09, E21.219, 257/E21.049, E29.069, E29.104; 438/336, 438/478, 479, 481, 496, 526, 694, 758; 428/428
See application file for complete search history.

(56) References Cited

U.S. PATENT DOCUMENTS

| | | | |
|---|---|---|---|
| 3,463,666 A | | 8/1969 | Kern et al. |
| 5,081,519 A | * | 1/1992 | Nishimura .................... 257/200 |
| 5,463,978 A | * | 11/1995 | Larkin et al. ..................... 117/89 |
| 2006/0008661 A1 | | 1/2006 | Wijesundara et al. |
| 2007/0238315 A1 | | 10/2007 | Cheng et al. |
| 2009/0294759 A1 | * | 12/2009 | Woo et al. ........................ 257/29 |
| 2012/0074387 A1 | * | 3/2012 | King ................................ 257/29 |

OTHER PUBLICATIONS

Sun et al. ("Epitaxial growth of SiC on complex substrates" Journal of Crystal Growth 227-228 (2001) 811-815).*
Emtsev et al. (Towards wafer-size grapheme layers by atmospheric pressure graphitization of silicon carbide Nature Materials vol. 8 p. 203, Mar. 2009).*
Office Action dated Sep. 11, 2012 received in related U.S. Appl. No. 12/942,498.
Sun et al., "Epitaxial growth of SiC on complex substrates", Journal of Crystal Growth, pp. 227-228, (2001) 811-815; doi: 10.1016/j.crystalgro.2009.12.017.
Emtsev et al., "Towards wafer-size grapheme layers by atmospheric pressure graphitization of silicon carbide", Nature Materials, vol. 8, p. 203, Mar. 2009.
Office Action dated Jan. 16, 2013 received in related U.S. Appl. No. 12/942,498.

* cited by examiner

*Primary Examiner* — Marcos D. Pizarro
*Assistant Examiner* — Sue Tang
(74) *Attorney, Agent, or Firm* — Scully, Scott, Murphy & Presser, P.C.; Louis J. Percello, Esq.

(57) ABSTRACT

A single crystalline silicon carbide layer can be grown on a single crystalline sapphire substrate. Subsequently, a graphene layer can be formed by conversion of a surface layer of the single crystalline silicon layer during an anneal at an elevated temperature in an ultrahigh vacuum environment. Alternately, a graphene layer can be deposited on an exposed surface of the single crystalline silicon carbide layer. A graphene layer can also be formed directly on a surface of a sapphire substrate or directly on a surface of a silicon carbide substrate. Still alternately, a graphene layer can be formed on a silicon carbide layer on a semiconductor substrate. The commercial availability of sapphire substrates and semiconductor substrates with a diameter of six inches or more allows formation of a graphene layer on a commercially scalable substrate for low cost manufacturing of devices employing a graphene layer.

6 Claims, 31 Drawing Sheets

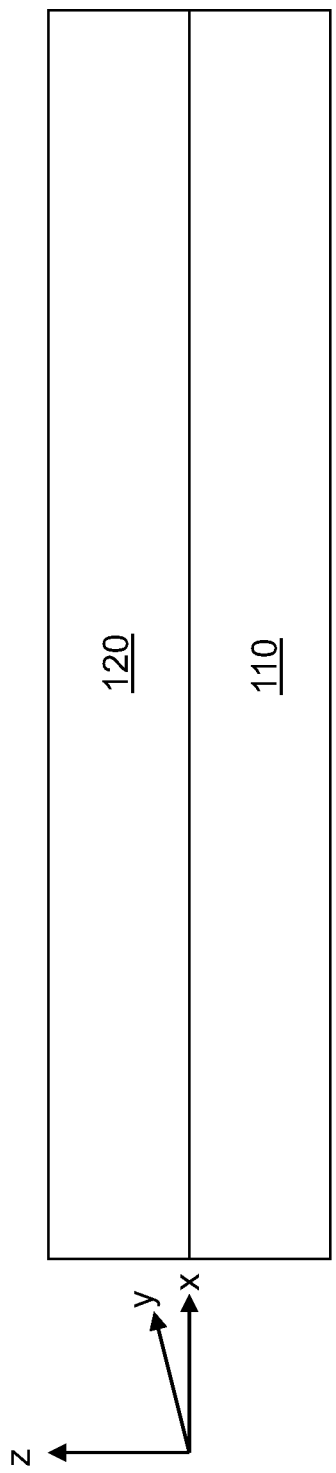
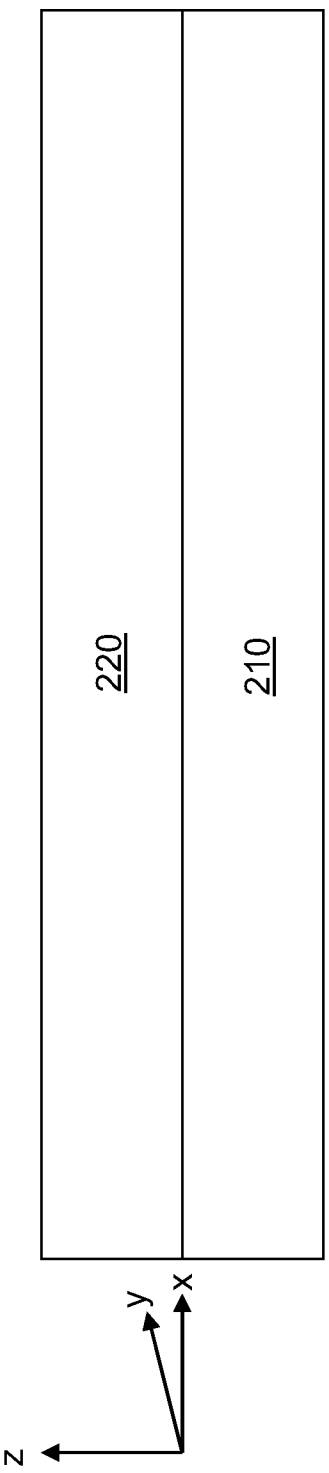

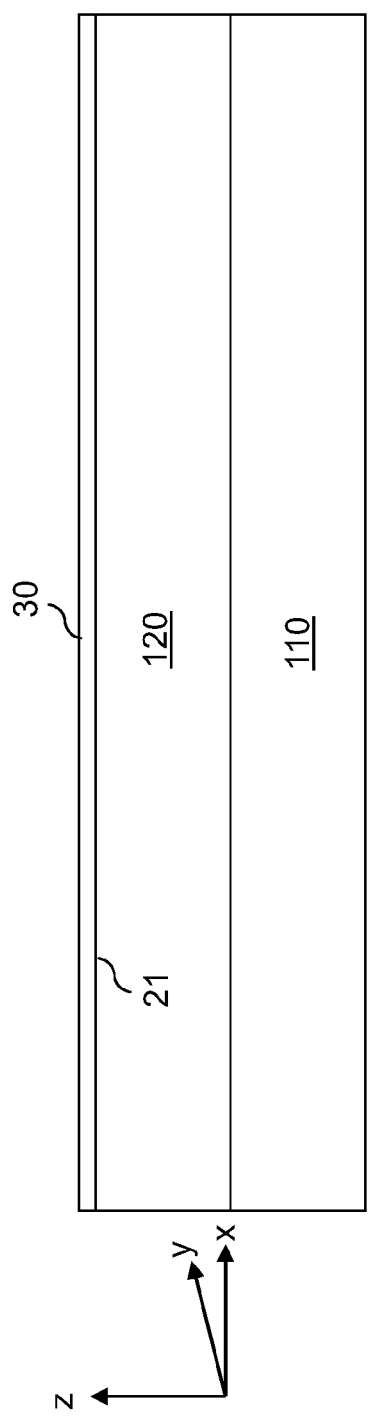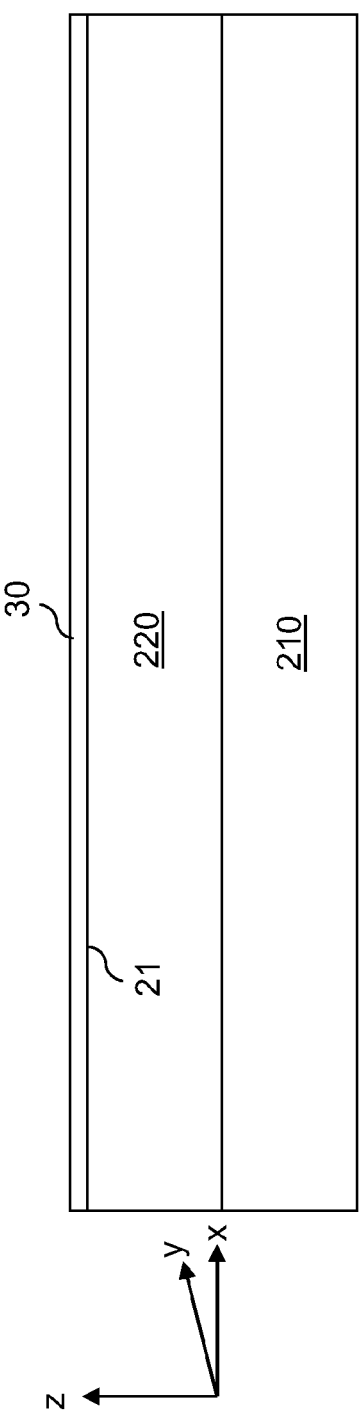

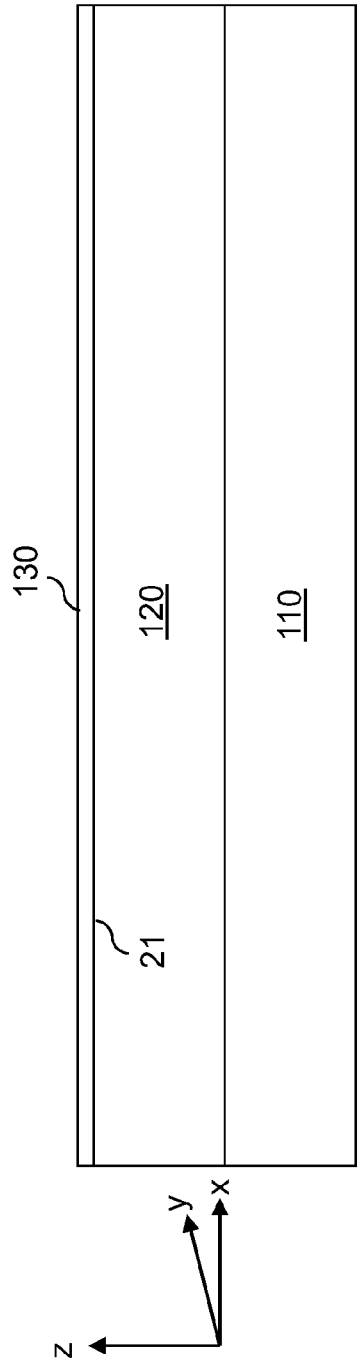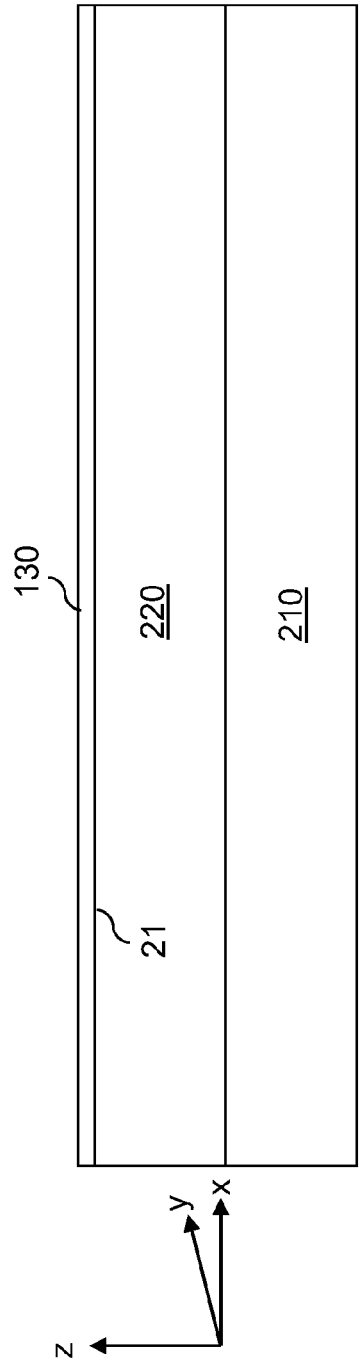

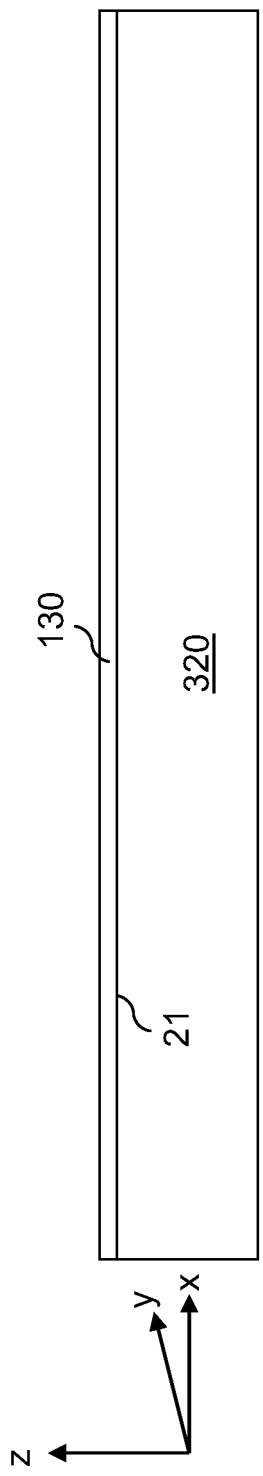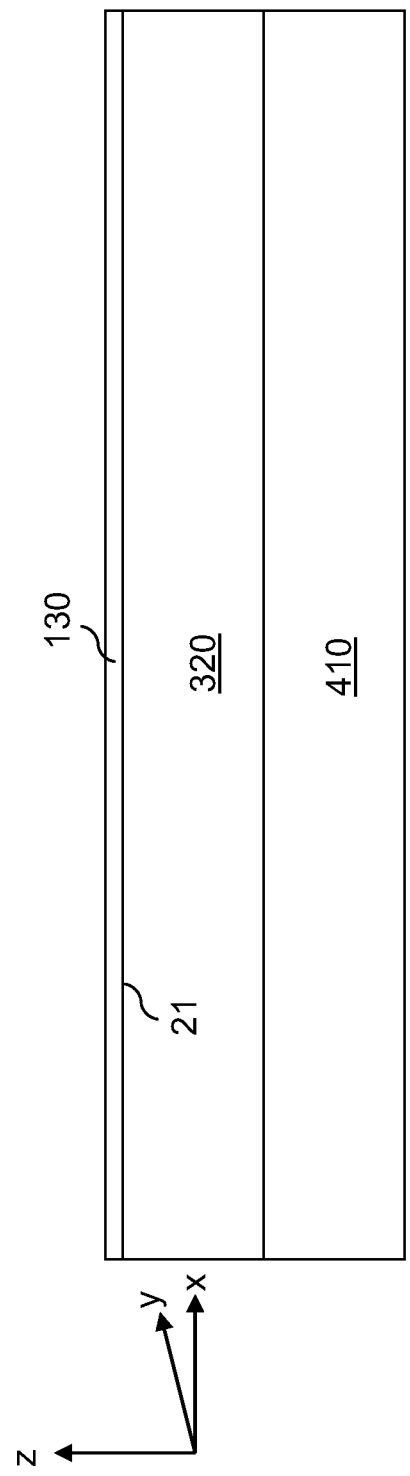

FORMATION OF A GRAPHENE LAYER ON A LARGE SUBSTRATE

STATEMENT REGARDING FEDERALLY SPONSORED RESEARCH OR DEVELOPMENT

This invention was made with government support under Defense Advanced Research Project Agency (DARPA) CERA Contract No. FA8650-08-C-7838 awarded by the U.S. Department of Defense. The government has certain rights in this invention.

RELATED APPLICATIONS

The present application is related to co-assigned and co-pending U.S. application Ser. Nos. 12/844,029 filed on Jul. 27, 2010 and 12/942,498 (being filed on the same date herewith).

BACKGROUND

The present invention relates to methods of forming a graphene layer on commercially available large substrates, and structures obtained by the same.

Graphene is a structure consisting of carbon as a two-dimensional sheet. A graphene monolayer has a thickness of about 0.34 nm, i.e., which is approximately the van der Waals atomic diameter of a single carbon atom. As defined by IUPAC, graphene is a one-atom thick, two-dimensional (2D) sheet of C atoms arranged in a hexagonal configuration. As used herein, a graphene layer can be a single two-dimensional sheet (one monolayer) of graphene, or alternately, a graphene layer can be a stack of a plurality of two-dimensional monolayers of graphene, which do not exceed more than 10 monolayers and is typically limited to less than 5 monolayers. Graphene provides excellent in-plane carrier mobility. Semiconductor devices employing graphene have been suggested in the art to provide high-switching-speed semiconductor circuits. Carbon atoms are arranged in a two-dimensional honeycomb crystal lattice in which each carbon-carbon bond has a length of about 0.142 nm.

A graphene layer may be grown by direct epitaxial deposition of carbon atoms on, i.e., addition of carbon atoms onto the surface of, a surface of a single crystalline silicon carbide (SiC) substrate having a hexagonal symmetry such as a (0001) surface of alpha silicon carbide. Alternately, graphene can be grown by heating a hexagonal surface of a single-crystalline silicon carbide material at a temperature greater than 1,100° C. The process of forming graphene by such a high temperature anneal is subtractive epitaxy, i.e. it is actually a reduction process in which silicon atoms on a hexagonal surface of a silicon carbide crystal sublime during the anneal and the remaining carbon atoms reassemble to form graphene that usually has an epitaxial relation to the substrate crystal.

Alpha silicon carbide has a hexagonal crystal structure, and beta silicon carbide has a cubic crystal structure of zinc blende type. FIG. 1 schematically shows the crystallographic structure of alpha silicon carbide. A (0001) surface is perpendicular to the c-axis and atoms in the (0001) surface are arranged in a pattern having a hexagonal symmetry. The plane in which the (0001) surface is located is referred to as a C plane. A (1102) surface of alpha silicon carbide crystal has a cubic symmetry, and does not have a hexagonal symmetry.

Silicon carbide substrates having a (0001) surface orientation are not commercially available at a diameter greater than 4 (or 5) inches at the present time. Such unavailability of silicon carbide (SiC) substrates currently makes it impossible to provide a 200 mm substrate or a 300 mm substrate containing a graphene layer. Thus, formation of graphene by epitaxy on a hexagonal surface of a silicon carbide crystal is limited to epitaxial deposition process performed directly on commercially available silicon carbide substrates having a hexagonal symmetry, but cannot be performed on substrates having a diameter of 6 inches or greater.

Prior art methods for forming a graphene layer on a single crystalline silicon carbide (SiC) substrate either by deposition or by subtraction of silicon has required a surface having a hexagonal lattice symmetry, which is the same type of lattice symmetry as the in-plane symmetry of the graphene layer. In other words, formation of a graphene layer on a silicon carbide single crystal as known in the art has required a (0001) surface of alpha silicon carbide having a hexagonal crystal structure. The (0001) surface of alpha silicon carbide has a hexagonal symmetry. Growing high quality graphene on SiC grown on Si by subtractive epitaxy is complicated, due to the fact that the Si substrate melts around 1400° C., and high quality graphene is preferably formed at a temperature greater than 1400° C. Furthermore, even if graphene is formed below 1400° C., there will be a quite substantial Si vapor pressure in the vicinity of SiC, due to the presence of the Si substrate, which may suppress the sublimation of Si from SiC needed to form graphene (see for example Tromp and Hannon Phys. Rev. Lett. 102, 106104 (2009)). Thus working with a substrate that does not contain Si, is very advantageous for the formation of graphene at T>1400° C.

BRIEF SUMMARY

A single crystalline silicon carbide layer can be grown on a single crystalline sapphire substrate. Subsequently, a graphene layer can be formed by conversion of a surface layer of the single crystalline silicon layer by performing an anneal at an elevated temperature in a vacuum environment. Alternately, a graphene layer can be deposited on an exposed surface of the single crystalline silicon carbide layer. A graphene layer can also be formed directly on a surface of a sapphire substrate or directly on a surface of a silicon carbide substrate. The commercial availability of sapphire substrates and semiconductor substrates with a diameter of six inches or more allows formation of a graphene layer on a commercially scalable substrate for low cost manufacturing of devices employing a graphene layer.

According to an aspect of the present invention, a method of forming a graphene layer on a sapphire substrate is provided. The method includes: forming a single crystalline semiconductor-carbon alloy layer on a sapphire substrate, wherein the single crystalline semiconductor-carbon alloy layer is epitaxially aligned to the sapphire substrate; and forming a graphene layer directly on the single crystalline semiconductor-carbon alloy layer.

According to another aspect of the present invention, a method of forming a graphene layer directly on a substrate is provided. The substrate is selected from a single crystalline sapphire substrate and a single crystalline silicon carbide substrate, and the graphene layer is formed by deposition of carbon atoms that form the graphene layer on a top surface of the substrate.

According to yet another aspect of the present invention, a structure including a graphene layer located on a single crystalline sapphire substrate is provided.

According to still another aspect of the present invention, a structure is provided, which includes a graphene layer located on a single crystalline silicon carbide substrate having a cubic crystal structure of zinc blende type located on a single crystalline sapphire substrate. The graphene layer is located directly on the single crystalline silicon carbide layer.

BRIEF DESCRIPTION OF THE SEVERAL VIEWS OF THE DRAWINGS

FIG. 2 is a vertical cross-sectional view of a first exemplary structure including a single crystalline semiconductor-carbon alloy layer having a hexagonal crystal structure and is epitaxially deposited on a (0001) surface of a sapphire substrate according to a first embodiment of the present invention.

FIG. 3 is a vertical cross-sectional view of a second exemplary structure including a single crystalline semiconductor-carbon alloy layer having a cubic crystal structure and is epitaxially deposited on a (1102) surface of a sapphire substrate according to a second embodiment of the present invention.

FIG. 16 is a vertical cross-sectional view of a third exemplary structure including a stack of a graphene layer formed by graphitization, a single crystalline semiconductor-carbon alloy layer having a hexagonal crystal structure, and a sapphire substrate having a (0001) surface orientation according to a third embodiment of the present invention.

FIG. 17 is a vertical cross-sectional view of a fourth exemplary structure including a stack of a graphene layer formed by graphitization, a single crystalline semiconductor-carbon alloy layer having a cubic crystal structure, and a sapphire substrate having a (1102) surface orientation according to a fourth embodiment of the present invention.

FIG. 19 is a vertical cross-sectional view of a fifth exemplary structure including a stack of a graphene layer formed by deposition of carbon, a single crystalline semiconductor-carbon alloy layer having a hexagonal crystal structure, and a sapphire substrate having a (0001) surface orientation according to a fifth embodiment of the present invention.

FIG. 20 is a vertical cross-sectional view of a sixth exemplary structure including a stack of a graphene layer formed by deposition of carbon, a single crystalline semiconductor-carbon alloy layer having a cubic crystal structure, and a sapphire substrate having a (1102) surface orientation according to a sixth embodiment of the present invention.

FIG. 25 is a vertical cross-sectional view of an eighth exemplary structure including a silicon carbide substrate and a graphene layer deposited thereupon.

FIG. 26 is a vertical cross-sectional view of a ninth exemplary structure including an underlying semiconductor substrate, a silicon carbide substrate, and a graphene layer deposited thereupon.

DETAILED DESCRIPTION

Figure 1:
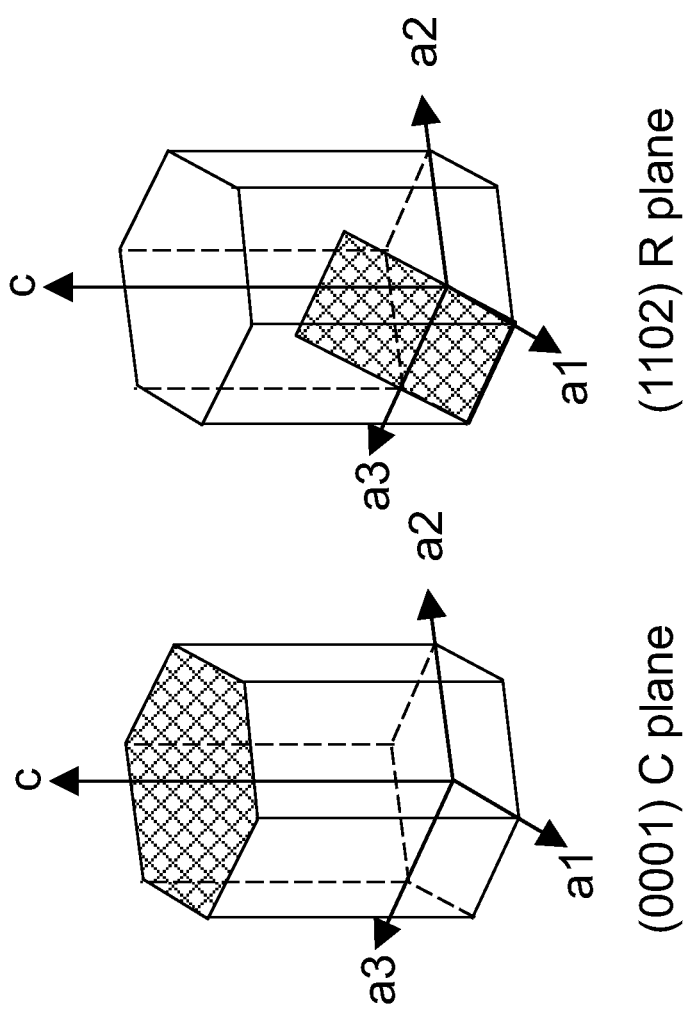
FIG. 1 is a diagram illustrating crystallographic structure of alpha silicon carbide, which has a hexagonal crystal structure, and the orientations of a (0001) surface and a (1102) surface in relation to the hexagonal crystal structure.

As stated above, the present invention relates to methods of forming a graphene layer on commercially available large substrates, and structures obtained by the same, which are now described in detail with accompanying figures. It is noted that like and corresponding elements are referred to by like reference numerals. The drawings are not in scale. In drawings including a coordinate system, the x-axis is along a horizontal direction within the plane of the drawing, the y-axis is along a direction perpendicular to the plane of the drawing, and the z-axis is along a vertical direction within the plane of the drawing.

As used herein, an "ultrahigh vacuum" environment refers to a vacuum environment having a pressure less than $1.0 \times 10^{-6}$ Torr.

Referring to FIG. 2, a first exemplary structure including according to a first embodiment of the present invention includes a vertical stack of a single crystalline semiconductor-carbon alloy layer 120 and a sapphire substrate 110. The single crystalline semiconductor-carbon alloy layer 120 has a hexagonal crystal structure and a (0001) surface orientation. The single crystalline semiconductor-carbon alloy layer 120 is epitaxially deposited on a (0001) surface of the sapphire substrate 110.

The sapphire substrate 110 consists essentially of aluminum oxide, i.e., $Al_2O_3$, and may include trace amounts of impurities at concentrations that do not affect the crystal structure of the sapphire substrate 110. Typically, the trace amounts of impurities do not exceed 0.02% in atomic concentration. The entirety of the sapphire substrate 110 is single crystalline. Sapphire substrates are currently commercially available at diameters up to 8 inches. The surface orientation of the sapphire substrate 110 is a (0001) orientation. The plane of the (0001) orientation is also referred to as a C plane.

The single crystalline semiconductor-carbon alloy layer 120 is a single crystalline layer in which all atoms are epitaxially aligned to all other atoms of the single crystalline semiconductor-carbon alloy layer 120 except for naturally present imperfections in the crystal lattice structure such as dislocations and/or point defects. Point defects can be substitutional defects or interstitial defects as known in the art.

In a first illustrative example, the single crystalline semiconductor-carbon alloy layer 120 can be a layer of a silicon-carbon alloy. Carbon has an atomic concentration from 20% to 75% in the silicon-carbon alloy, and preferably has an atomic composition from 45% to 55% in the silicon-carbon alloy.

In a second illustrative example, the single crystalline semiconductor-carbon alloy layer 120 can be a layer of a silicon-germanium-carbon alloy. Carbon has an atomic concentration from 20% to 75% in the silicon-germanium-carbon alloy, and preferably has an atomic composition from 45% to 55% in the silicon-germanium-carbon alloy.

In a third illustrative example, the single crystalline semiconductor-carbon alloy layer 120 can be a layer of a germanium-carbon alloy. Carbon has an atomic concentration from 20% to 75% in the germanium-carbon alloy, and preferably has an atomic composition from 45% to 55% in the germanium-carbon alloy.

In a fourth illustrative example, the single crystalline semiconductor-carbon alloy layer 120 can be a superlattice including multiple repetitions of a first material layer and a second material layer. At least one of the first material layer and a second material layer includes carbon, and at least one of the first material layer and a second material layer includes at least one of silicon and germanium. The first material layer may include silicon, germanium, or an alloy of silicon and the second material layer may include carbon or a carbon alloy. An exemplary combination of the first material layer and the second material layer is a silicon layer and a carbon layer. Another exemplary combination of the first material layer is a silicon boride layer and a carbon layer.

The single crystalline semiconductor-carbon alloy layer 120 is epitaxially deposited on the top surface of the sapphire substrate 110. Because the top surface of the sapphire substrate 110 has a hexagonal symmetry, which is the symmetry of the (0001) surface of a hexagonal crystal structure, the single crystalline semiconductor-carbon alloy layer 120 is formed with the same hexagonal crystal symmetry with a (0001) surface orientation, which also has a hexagonal symmetry, i.e., is invariant under rotation by 60 degrees along the z-axis that is perpendicular to the interface between the sapphire substrate 110 and the single crystalline semiconductor-carbon alloy layer 120. The single crystalline semiconductor-carbon alloy layer 120 can be a single crystalline semiconductor carbide layer such as a single crystalline silicon carbide layer. In this case, the single crystalline silicon carbide layer has alpha phase that has hexagonal crystal structure in which the surface orientation, i.e., the orientation of the x-y plane, is a (0001) orientation.

Referring to FIG. 3, a second exemplary structure including according to a second embodiment of the present invention includes a vertical stack of a single crystalline semiconductor-carbon alloy layer 220 and a sapphire substrate 210. The single crystalline semiconductor-carbon alloy layer 220 has a cubic crystal structure of zinc blende type and a (110) surface orientation. The single crystalline semiconductor-carbon alloy layer 220 is epitaxially deposited on a (1102) surface of the sapphire substrate 210.

The sapphire substrate 210 consists essentially of aluminum oxide as in the first embodiment. The entirety of the sapphire substrate 210 is single crystalline. However, the surface orientation of the sapphire substrate 210 is a (1102) orientation. The plane of the (1102) orientation is also referred to as an R plane.

The single crystalline semiconductor-carbon alloy layer 220 is a single crystalline layer in which all atoms are epitaxially aligned to all other atoms of the single crystalline semiconductor-carbon alloy layer 220 except for naturally present imperfections in the crystal lattice structure such as dislocations and/or point defects. Point defects can be substitutional defects or interstitial defects as known in the art. The composition of the single crystalline semiconductor-carbon alloy layer 220 can vary in the same manner as in the first embodiment.

The single crystalline semiconductor-carbon alloy layer 220 is epitaxially deposited on the top surface of the sapphire substrate 210. The top surface of the sapphire substrate 210 has a cubic symmetry, which is the symmetry of the (1102) surface of a hexagonal crystal structure. The single crystalline semiconductor-carbon alloy layer 220 is formed with cubic crystal symmetry with a (110) surface orientation, which has a rectangular symmetry, i.e., is invariant under rotation by 180 degrees along the z-axis that is perpendicular to the interface between the sapphire substrate 210 and the single crystalline semiconductor-carbon alloy layer 220. The single crystalline semiconductor-carbon alloy layer 220 can be a single crystalline semiconductor carbide layer such as a single crystalline silicon carbide layer. In this case, the single crystalline silicon carbide layer has beta phase that has cubic crystal structure of zinc blende type. The surface orientation, i.e., the orientation of the x-y plane, of the single crystalline semiconductor-carbon alloy layer 220 is a (110) orientation.

Single crystalline sapphire substrates of different crystallographic orientations are employed to form the first and second exemplary structures. To form the first exemplary structure, a single crystalline sapphire substrate having a (0001) surface orientation can be employed. To form the second exemplary structure, a single crystalline sapphire substrate having a (1102) surface orientation can be employed. The processing methods employed to form the first and second exemplary structures can be the same. Because identical processing steps can be employed for the first and second exemplary structures, each of the single crystalline sapphire substrate having a (0001) surface orientation and the single crystalline sapphire substrate having a (1102) surface orientation are herein referred to as a single crystalline sapphire substrate. The first exemplary structure can be eventually formed on the single crystalline sapphire substrate having a (0001) surface orientation, and the second exemplary structure can be eventually formed on the single crystalline sapphire substrate having a (1102) surface. The common processing steps are described below.

First, appropriate analysis can be performed before deposition of silicon carbide as needed on each single crystalline sapphire substrate, be it the single crystalline sapphire substrate having a (0001) surface orientation or the single crystalline sapphire substrate having a (1102) surface. For example, x-ray data on the sapphire substrates alone can be generated before any deposition on a single crystalline sapphire substrate. Subsequently, each sapphire substrate can be cleaned by chemical methods. Each single crystalline sapphire substrate can be cleaned employing a SC1 clean process in a solution including $H_2O_2$, $NH_4OH$, and $H_2O$. Thereafter, each single crystalline sapphire substrate can be cleaned employing a SC2 clean process in a solution including $H_2O_2$, HCl, and $H_2O$. The surface of each single crystalline sapphire substrate can be treated with dilute hydrofluoric acid to form a hydrogen-terminated surface. Isopropyl alcohol and/or nitrogen gas can be employed to dry the hydrogen-terminated surface without affecting the hydrogen-termination. Any equivalent surface clean that removes impurities from the surface of the sapphire substrate can also be employed.

The sapphire substrate can be subsequently placed in a vacuum environment. Specifically, after formation of the hydrogen-terminated surface, the sapphire substrate can be loaded in a process chamber, which can be then pumped down to a base pressure less than $5.0 \times 10^{-8}$ Torr. Generally, the vacuum environment can be provided by an ultrahigh vacuum chamber having a base pressure less than $1.0 \times 10^{-6}$ Torr. Each sapphire substrate can be then transferred to a process chamber, which can be maintained at a base pressure less than $2.0 \times 10^{-8}$ Torr. While the transfer can be typically effected, for example, at a temperature from 300° C. to 800° C., the transfer can be effected at any operating temperature of the process chamber provided mechanical assemblies support a transfer at such a temperature.

The process chamber can be filled with hydrogen gas at a purge pressure, which can be, for example, between 0.1 mTorr to 100 mTorr, and typically from 1 mTorr to 10 mTorr. The temperature of the process chamber can be ramped to a deposition temperature, at which a subsequent deposition process is to be performed. Any other temperature ramp rate may be employed provided that the process chamber is capable of withstanding the rate of change in temperature without mechanical problems (such as component breakage). Any equivalent thermal surface clean can also be employed.

A semiconductor-containing precursor and a carbon-containing precursor can be provided into the vacuum environment so that a single crystalline semiconductor-carbon alloy layer is epitaxially formed directly on the crystallographic surface of the sapphire substrate. Specifically, after the hydrogen gas is shut off, the silicon-containing reactant gas and the carbon-containing reactant gas are flown into the process chamber simultaneously. The temperature of the process chamber can be maintained at a predetermined processing temperature, or can be ramped as needed to facilitate deposition. In general, the deposition temperature for the single crystalline semiconductor-carbon alloy layer can be from 800° C. to 2,000° C., and typically from 900° C. to 1,400° C., although lesser and greater deposition temperatures can also be employed. Further, depending on the composition and the desired deposition rate, the deposition temperature can be adjusted.

During the deposition step, the pressure in the process chamber can be maintained in a range from 0.1 mTorr to 100 mTorr, and typically from 1 mTorr to 10 mTorr, although lesser and greater deposition pressure can also be employed. The semiconductor-containing precursor includes the semiconductor component of a single crystalline semiconductor-carbon alloy layer, and the carbon-containing precursor includes carbon. Specifically, each molecule of the semiconductor-containing precursor includes a semiconductor atom or component atoms of a compound semiconductor material. Further, each molecule of the semiconductor-containing precursor includes at least one hydrogen atom, at least one chlorine atom, at least one fluorine atom, or a combination thereof. Each molecule of the carbon-containing precursor includes at least one unsaturated hydrocarbon atom.

The single crystalline semiconductor-carbon alloy layer can have an atomic carbon concentration consistent with a (0001) surface orientation during growth and a hexagonal crystal structure if deposited directly on a (0001) plane of a sapphire substrate. In this case, a (0001) surface of the single crystalline semiconductor-carbon alloy layer contacts a (0001) plane of the sapphire substrate at an interface. The single crystalline semiconductor-carbon alloy layer can have an atomic carbon concentration consistent with a (110) surface orientation during growth and a cubic crystal structure if deposited directly on a (1102) plane of a sapphire substrate. In this case, a (110) surface of the single crystalline semiconductor-carbon alloy layer contacts a (1102) plane of the sapphire substrate at an interface.

In case the single crystalline semiconductor-carbon alloy layer is a single crystalline silicon-carbon alloy layer, the semiconductor-containing precursor includes silicon. For example, the single crystalline semiconductor-carbon alloy layer can have an atomic carbon concentration consistent from 40% to 60%. The carbon-containing precursor can include carbon and hydrogen. In case the single crystalline semiconductor-carbon alloy layer is a single crystalline silicon-carbon alloy layer, the semiconductor-containing precursor can be selected from $SiH_4$, $Si_2H_6$, $SiH_3Cl$, $SiH_2Cl_2$, $SiHCl_3$, and $SiCl_4$. If the single crystalline semiconductor-carbon alloy layer includes germanium or a compound semiconductor in addition to silicon or in lieu of silicon, the semiconductor-containing precursor can be selected accordingly. The carbon-containing precursor can be selected from $C_2H_2$, $C_2H_4$, $C_nH_{2n-2}$, and $C_nH_{2n}$, wherein n is an integer greater than 2. If the single crystalline semiconductor-carbon alloy layer is a single crystalline silicon carbide layer, the silicon-containing reactant gas can be 100% silane ($SiH_4$) and the carbon-containing reactant gas can be 50% ethelene ($C_2H_4$) with helium as the balance gas. The flow rate of 100% silane can be from 2 sccm to 30 sccm, and the flow rate of 50% ethelene can be from 2 sccm to 40 sccm.

If the single crystalline silicon-carbon alloy layer is a single crystalline silicon carbide layer and a single crystalline sapphire substrate having a (0001) surface orientation is employed, a single crystalline silicon carbide layer with a hexagonal crystal structure, i.e., in alpha phase, and a (0001) surface orientation can be epitaxially deposited. Thus, the first exemplary structure can be formed such that the single crystalline semiconductor-carbon alloy layer 120 is the single crystalline silicon carbide layer in alpha phase. If the single crystalline silicon-carbon alloy layer is a single crystalline silicon carbide layer a single crystalline sapphire substrate having a (1102) surface orientation is employed, a single crystalline silicon carbide layer with cubic crystal structure of the zinc blende type, i.e., in beta phase, and a (110) surface orientation can be epitaxially deposited. Thus, the second exemplary structure of FIG. 3 can be formed such that the single crystalline semiconductor-carbon alloy layer 220 is the single crystalline silicon carbide layer in beta phase.

The composition of the single crystalline semiconductor-carbon alloy layer, and correspondingly, the composition of the semiconductor-containing precursor and the carbon-containing precursor are selected to maintain a (0001) growth plane and a hexagonal crystal structure if the single crystalline semiconductor-carbon alloy layer is formed on a (0001) sapphire substrate Likewise, if the single crystalline semiconductor-carbon alloy layer is formed on a (1102) sapphire substrate, the composition of the semiconductor-containing precursor and the carbon-containing precursor are selected to maintain a (110) growth plane and a cubic crystal structure.

Once the deposition step is completed, the process chamber can be evacuated to a base pressure, and the temperature of the process chamber can be lowered to a temperature suitable for unloading of the first and/or second exemplary structure.

Samples of the first exemplary structure and the second exemplary structure have been formed and tested in the course of experiments leading to the instant invention employing the methods describe above. These samples have been subjected to various types of analysis including x-ray diffraction, secondary ion mass spectroscopy, and transmission electron microscopy.

Figure 4:
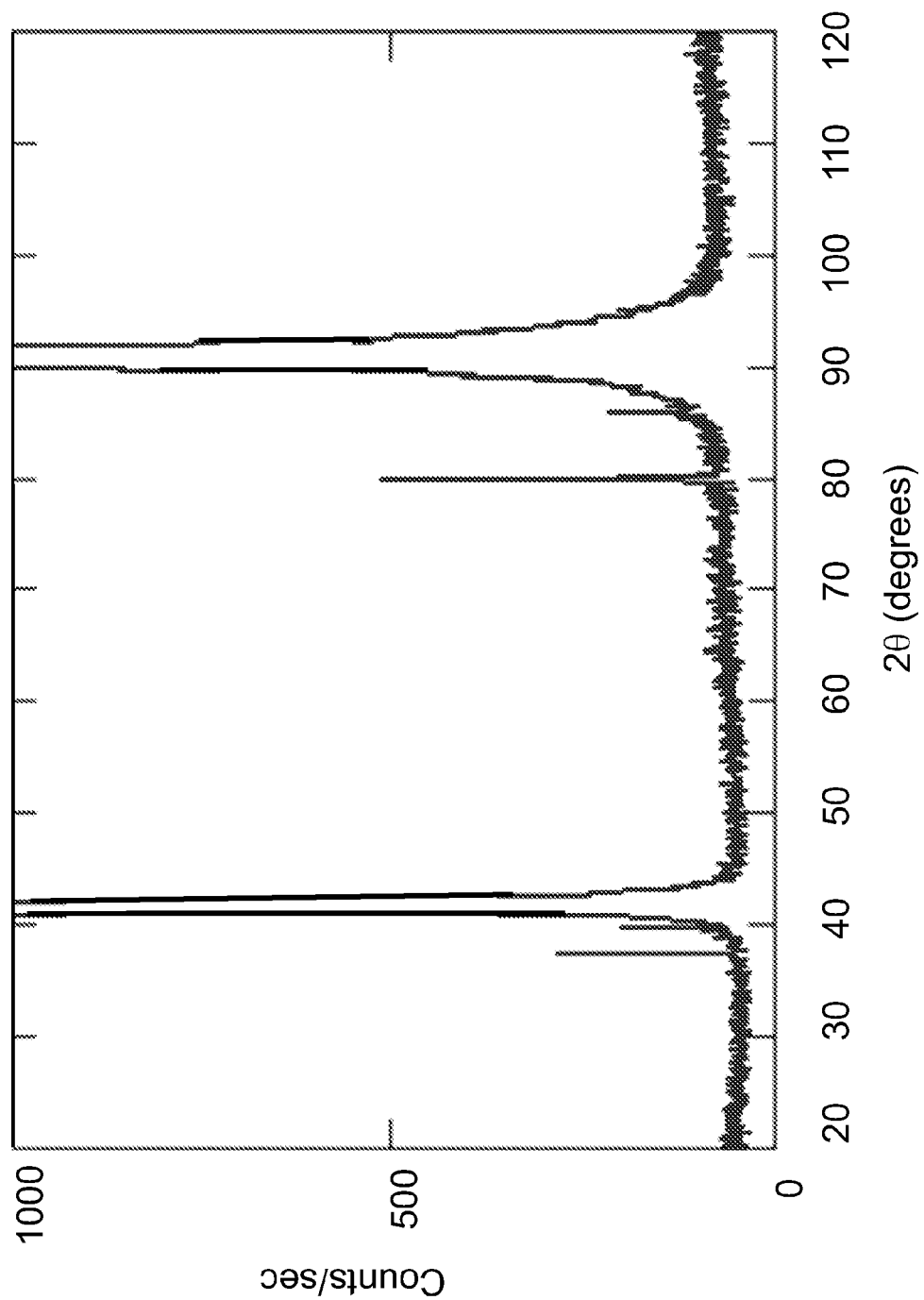
FIG. 4 is a graph of x-ray diffraction (XRD) data from a sapphire substrate having a (0001) surface orientation before deposition of any single crystalline semiconductor-carbon alloy layer.
Figure 5:
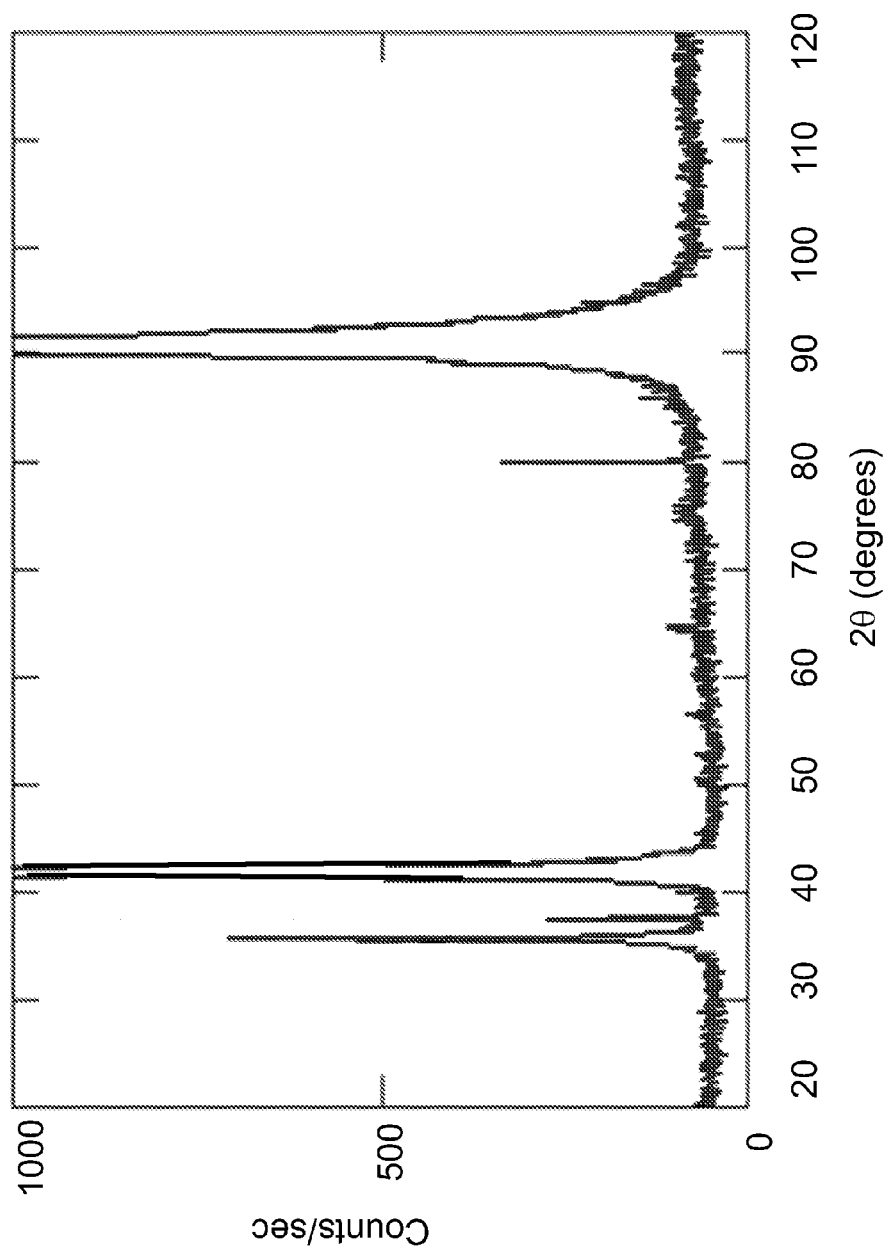
FIG. 5 is a graph of x-ray diffraction (XRD) data from a stack of a single crystalline semiconductor-carbon alloy layer having a hexagonal crystal structure and a (0001) surface orientation and a sapphire substrate having a (0001) surface orientation.
Figure 6:
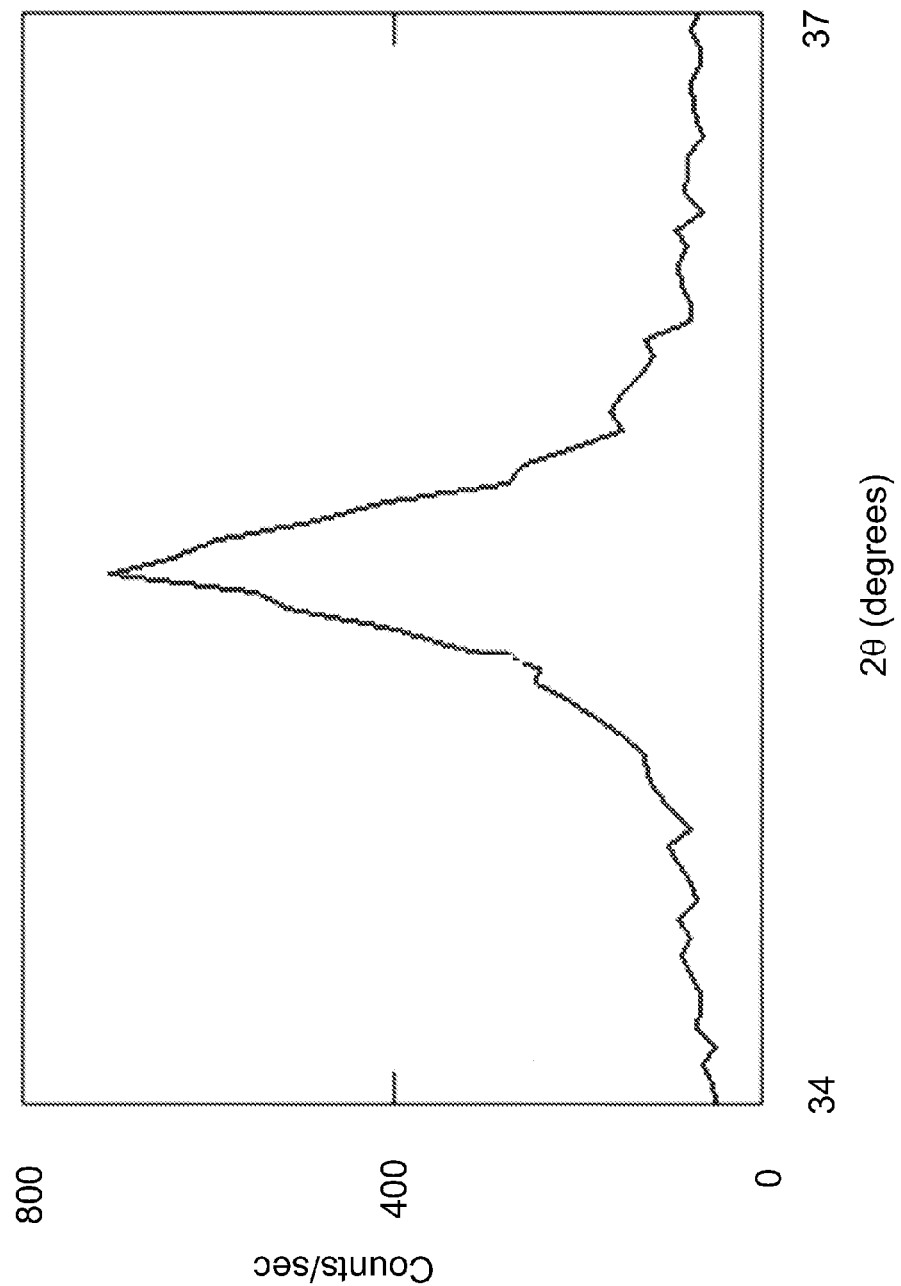
FIG. 6 is a magnified graph of x-ray diffraction (XRD) data of FIG. 5 for the 2θ range from 34 degrees to 37 degrees.

Referring to FIGS. 4-6, x-ray diffraction (XRD) data from a first sample having the first exemplary structure is shown before and after formation of a single crystalline silicon carbide layer in alpha phase, which corresponds to the single crystalline semiconductor-carbon alloy layer 120 of FIG. 2. Specifically, FIG. 4 is a graph showing x-ray diffraction data from a sapphire substrate having a (0001) surface orientation before deposition of the single crystalline silicon carbide layer. Each peak in the 2θ scan in FIG. 4 corresponds to a periodicity in the crystallographic planes involved in the scattering of the diffracted x-ray photons and present in the (0001) sapphire substrate.

FIG. 5 is a graph of x-ray diffraction (XRD) data from the first sample after deposition of the single crystalline silicon carbide layer in alpha phase, which has a hexagonal crystal structure. The first sample is a stack of a single crystalline semiconductor-carbon alloy layer having a hexagonal crystal structure and a (0001) surface orientation and the underlying sapphire substrate having a (0001) surface orientation. FIG. 6 is a magnified graph of x-ray diffraction (XRD) data of FIG. 5 for the 2θ range from 34 degrees to 37 degrees. A prominent peak is present at the 2θ value of 35.5 degrees. This peak corresponds to a (0001) plane of the single crystalline silicon carbide layer in alpha phase. The full width at half maximum is about 0.273 degrees, which corresponds to an average domain size of at least 34 nm. The presence of the peak at the 2θ value of 35.5 degrees shows that the silicon carbide layer present in the first sample has a hexagonal crystal structure and alpha phase, and is oriented along the (0001) orientation, i.e., the surface of the silicon carbide layer is a (0001) surface.

Figure 7:
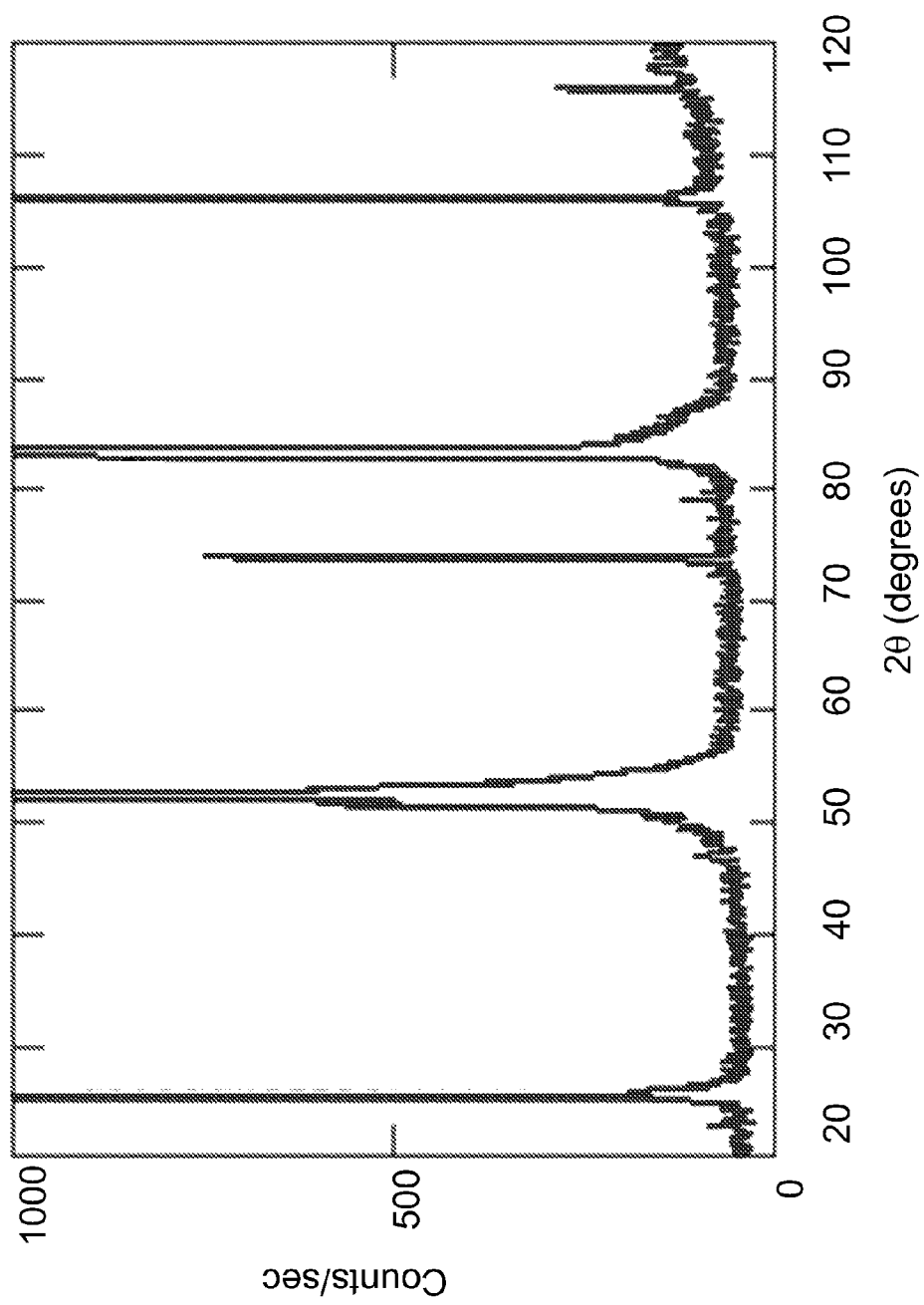
FIG. 7 is a graph of x-ray diffraction (XRD) data from a sapphire substrate having a (1102) surface orientation before deposition of any single crystalline semiconductor-carbon alloy layer.
Figure 8:
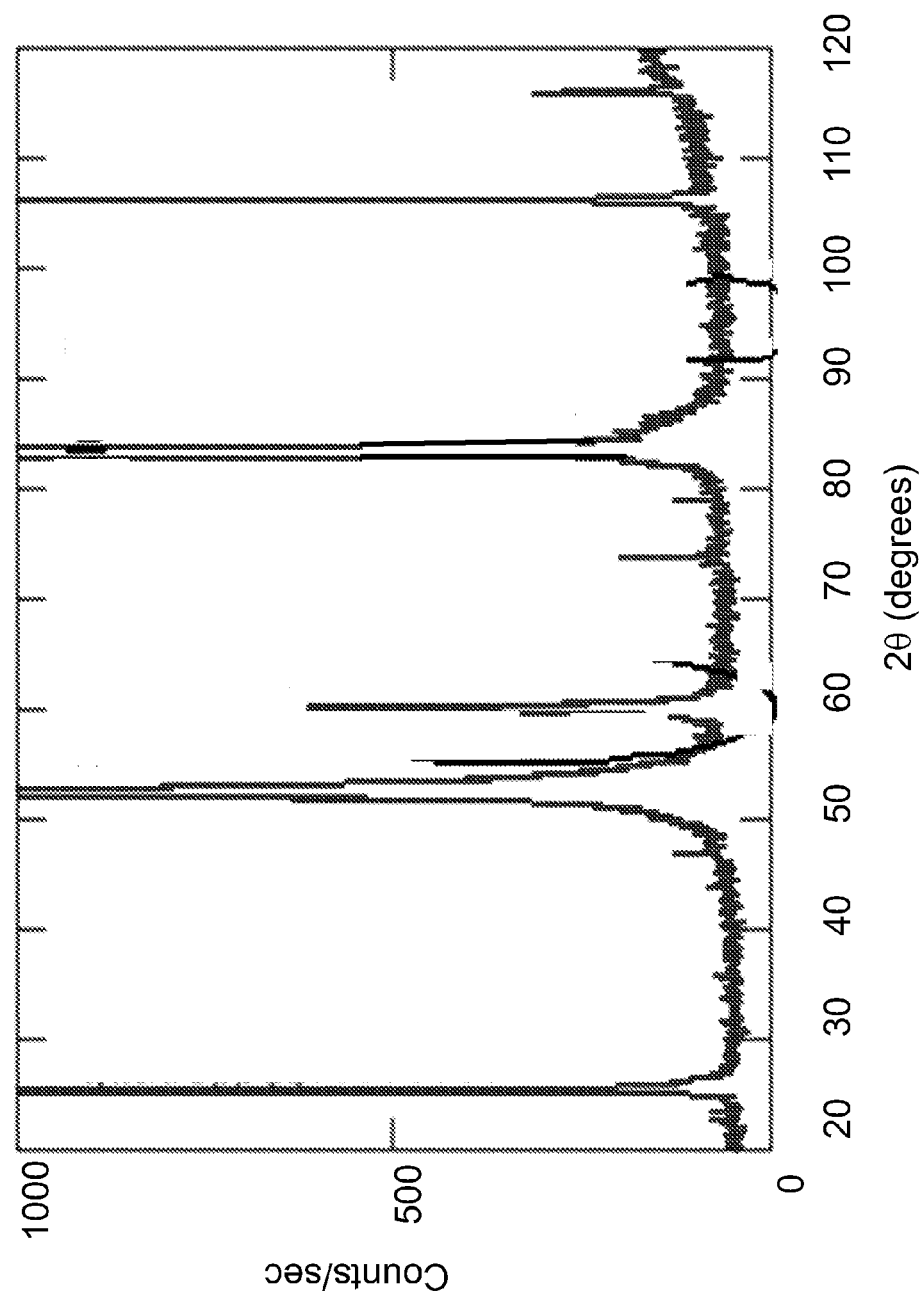
FIG. 8 is a graph of x-ray diffraction (XRD) data from a stack of a single crystalline semiconductor-carbon alloy layer having a hexagonal crystal structure and a (001) surface orientation and a sapphire substrate having a (1102) surface orientation.
Figure 9:
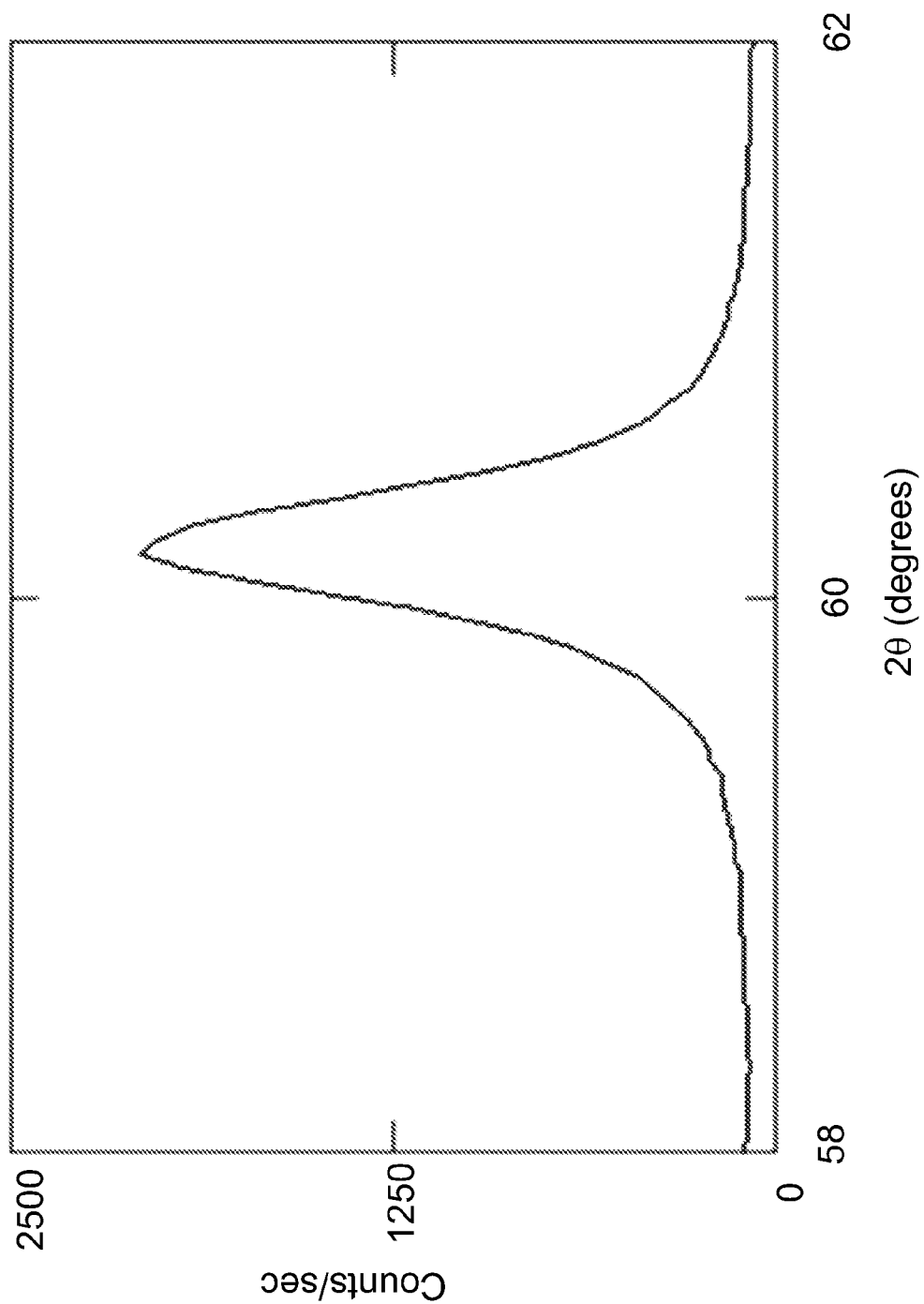
FIG. 9 is a magnified graph of x-ray diffraction (XRD) data of FIG. 8 for the 2θ range from 58 degrees to 62 degrees.

Referring to FIGS. 7-9, x-ray diffraction (XRD) data from a second sample having the second exemplary structure is shown before and after formation of a single crystalline silicon carbide layer in beta phase, which corresponds to the single crystalline semiconductor-carbon alloy layer 220 of FIG. 3. Specifically, FIG. 7 is a graph showing x-ray diffraction data from a sapphire substrate having a (1102) surface orientation before deposition of the single crystalline silicon carbide layer. Each peak in the 2θ scan in FIG. 7 corresponds to a periodicity in the crystallographic planes involved in the scattering of the diffracted x-ray photons and present in the (1102) sapphire substrate.

FIG. 8 is a graph of x-ray diffraction (XRD) data from the second sample after deposition of the single crystalline silicon carbide layer in alpha phase, which has a cubic crystal structure of zinc blende type. The second sample is a stack of a single crystalline semiconductor-carbon alloy layer having a cubic crystal structure and a (110) surface orientation and the underlying sapphire substrate having a (1102) surface orientation. FIG. 9 is a magnified graph of x-ray diffraction (XRD) data of FIG. 5 for the 2θ range from 58 degrees to 62 degrees. A prominent peak is present at the 2θ value of 61.1 degrees. This peak corresponds to a (110) plane of the single crystalline silicon carbide layer in alpha phase. The full width at half maximum in FIG. 9 corresponds to an average domain size of at least 20 nm. The presence of the peak at the 2θ value of 61.1 degrees shows that the silicon carbide layer present in the second sample has a cubic crystal structure and alpha phase, and is oriented along the (110) orientation, i.e., the surface of the silicon carbide layer is a (110) surface.

Figure 10:
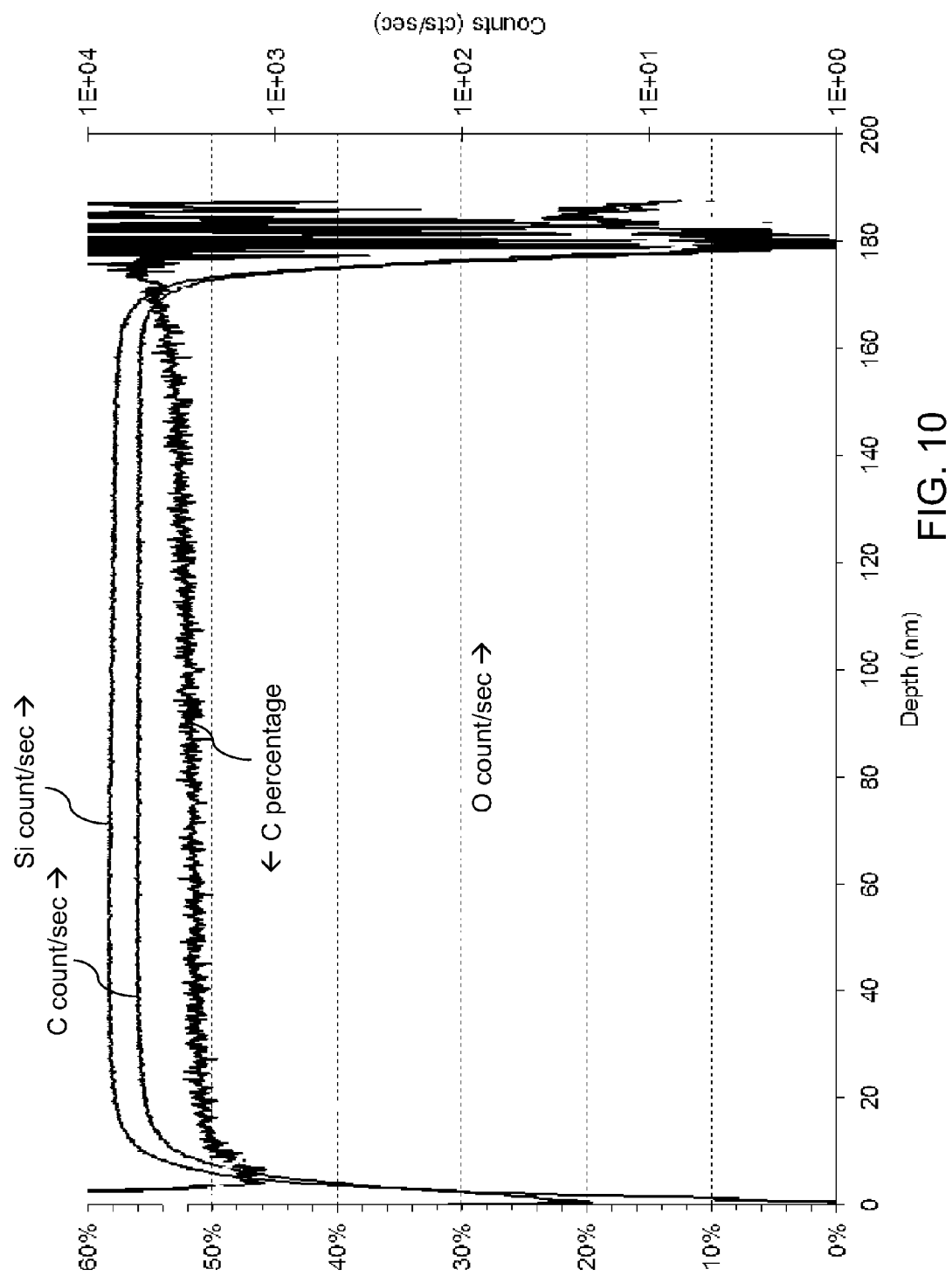
FIG. 10 is a graph of data from a secondary ion mass spectroscopy (SIMS) run on a single crystalline silicon carbide layer having a hexagonal crystal structure with a (0001) surface orientation and is epitaxially grown on a sapphire substrate having a (0001) surface orientation.

Referring to FIG. 10, a graph shows data from a secondary ion mass spectroscopy (SIMS) run on the first sample of FIGS. 5 and 6. As discussed above, the first sample included a stack of a sapphire substrate having a (0001) surface orientation and a single crystalline silicon carbide layer having a hexagonal crystal structure, having a (0001) surface orientation, and epitaxially deposited thereupon employing the methods described above. Silicon, carbon, and oxygen contents of the first sample was analyzed as a function of depth from the top surface of the sample, i.e., from the top surface of the single crystalline silicon carbide layer. The amount of detected silicon, the amount of detected carbon, and the amount of detected oxygen during the SIMS run are plotted on a log scale, which is provided on the right side vertical axis of the graph employing counts per second as the unit. Upon calibration of the sensitivity of the detector, the amount of detected silicon, the amount of detected carbon, and the amount of detected oxygen can be converted to atomic concentration. The atomic percentage of carbon thus calculated is also plotted on the same graph using the scale on the left side vertical axis of the graph. The SIMS data shows that the percentage of carbon in the single crystalline silicon carbide layer in the first sample is about 50%, showing that the single crystalline silicon carbide layer in the first sample is substantially stoichiometric, i.e., has a Si to C ratio of 1:1.

Figure 11:
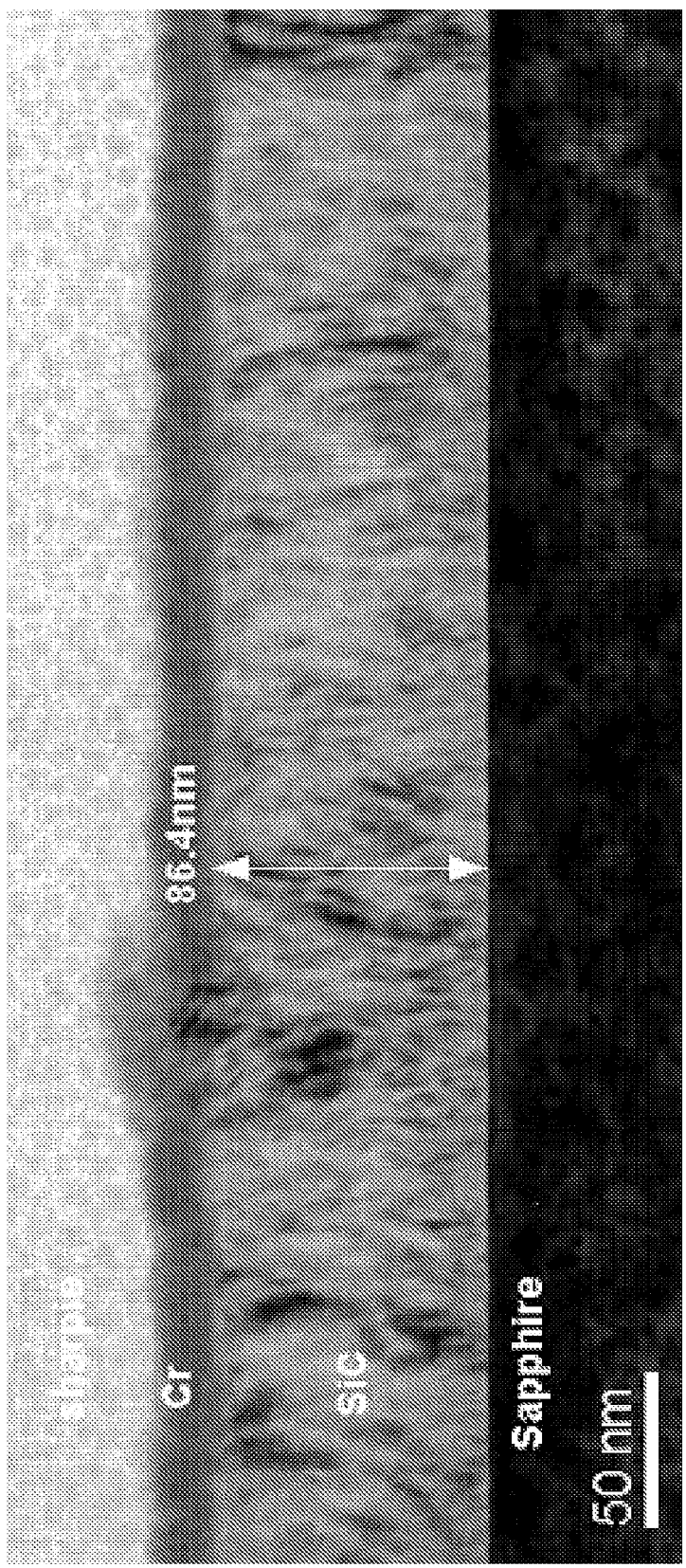
FIG. 11 is a transmission electron microscopy (TEM) picture of an area of a sample including a stack of a single crystalline semiconductor-carbon alloy layer having a hexagonal crystal structure and a (001) surface orientation and a sapphire substrate having a (1102) surface orientation.
Figure 12:
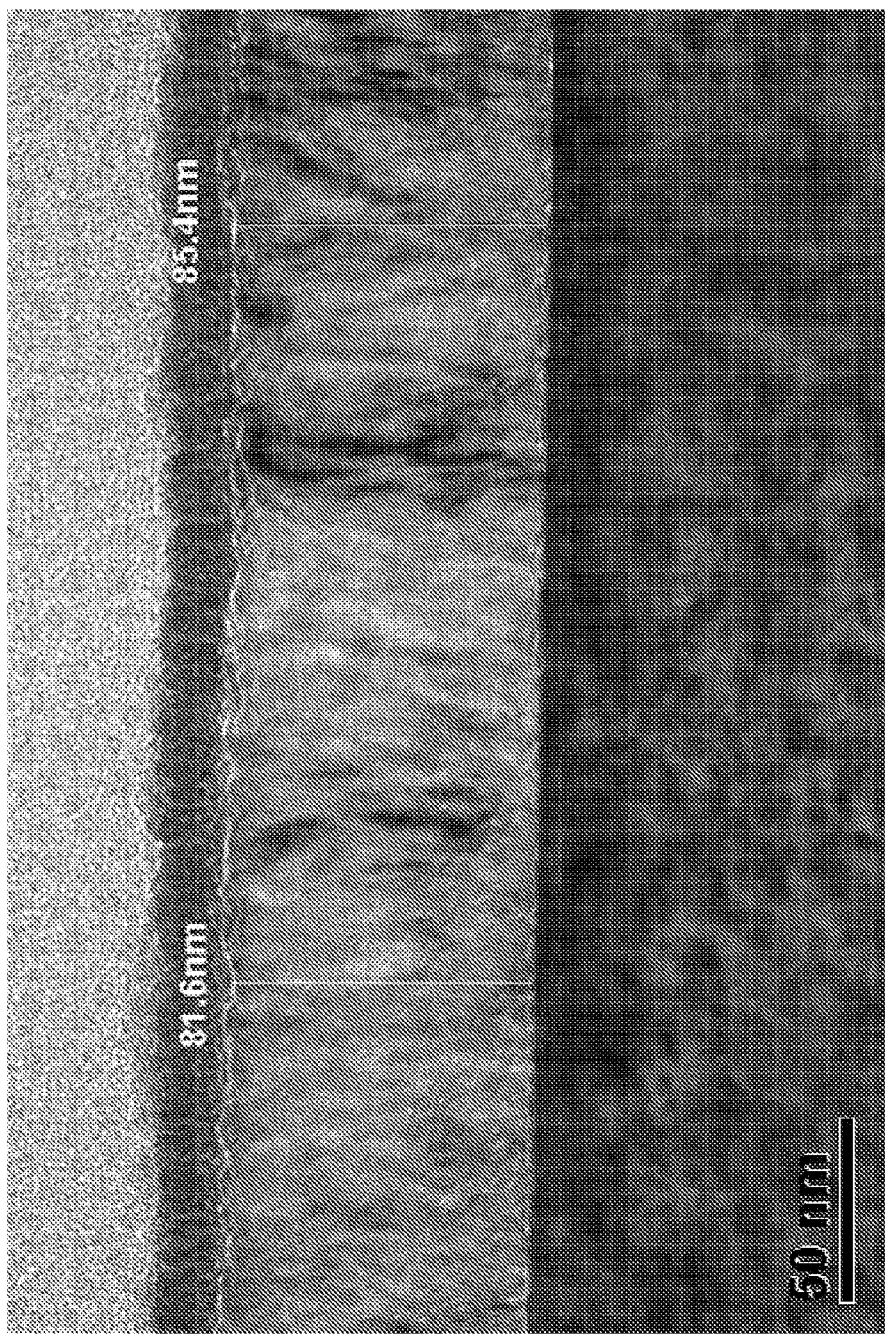
FIG. 12 is a transmission electron microscopy (TEM) picture of another area of the sample of FIG. 11

Referring to FIG. 11, a transmission electron microscopy (TEM) image of an area of the second sample is shown. The second sample includes a stack of a sapphire substrate having a (1102) surface orientation and a single crystalline semiconductor-carbon alloy layer having a hexagonal crystal structure and a (001) surface orientation. A chromium layer and a sharpie layer were added to the sample prior to preparation of the TEM sample in order to enhance the contrast of the TEM image. FIG. 12 shows a TEM image of another area of the second sample.

Figure 13:
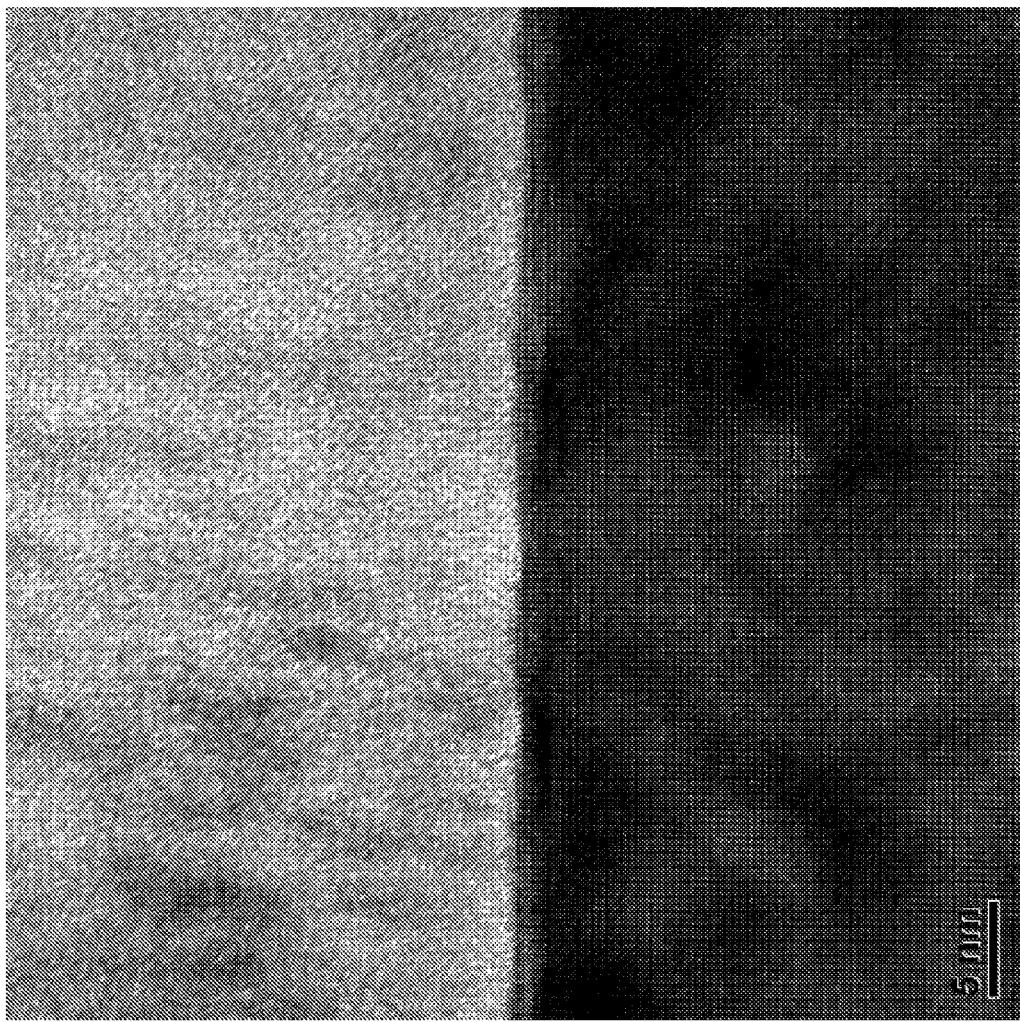
FIG. 13 is a high magnification transmission electron microscopy (TEM) picture of an area of the sample of FIG. 11

Referring to FIG. 13, a high magnification TEM image of an area of the second sample is shown. The high magnification TEM image shows a periodic pattern across the sapphire area (the dark area in the lower portion of the TEM image) and another periodic across the silicon carbide area (the light area in the upper portion of the TEM image).

Figure 14:
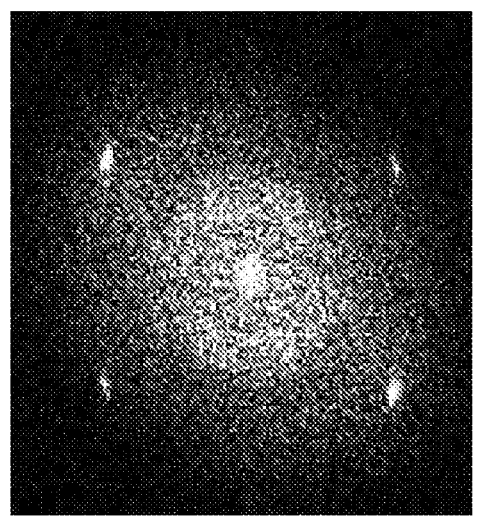
FIG. 14 is a Fourier transformation image of the silicon carbide area of the high magnification transmission electron microscopy (TEM) picture of FIG. 13.

Referring to FIG. 14, a Fourier transformation image of the silicon carbide area of the high magnification transmission electron microscopy (TEM) image of FIG. 13 shows that the periodicity of the lattice within the plane of the high magnification TEM image of FIG. 13 has a square symmetry with a unit length of 0.24 nm. This is consistent with a single crystalline silicon carbide layer having a cubic structure and grown in a <110> direction with a corresponding (110) surface during growth. Thus, the Fourier transformation image of FIG. 14 verifies the x-ray diffraction data about the crystallographic orientation of the single crystalline silicon carbide layer.

Figure 15:
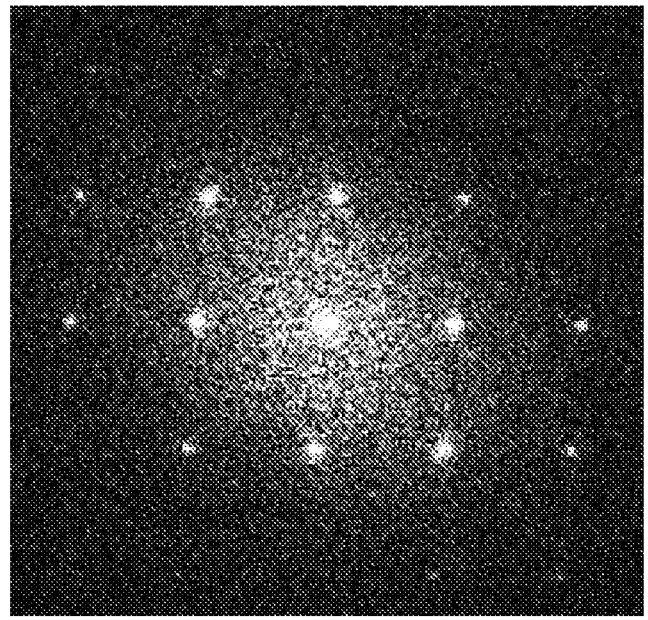
FIG. 15 is a Fourier transformation image of the sapphire area of the high magnification transmission electron microscopy (TEM) picture of FIG. 13.

Referring to FIG. 15, a Fourier transformation image of the sapphire area of the high magnification transmission electron microscopy (TEM) image of FIG. 13 shows that the periodicity of the lattice within the plane of the high magnification TEM image of FIG. 13 has a square symmetry with a unit length of 0.34 nm. This is consistent with a single crystalline sapphire substrate having a <1102> direction along the vertical direction, i.e., in the direction perpendicular to the interface between the sapphire substrate and the single crystalline silicon carbide layer.

Referring to FIG. 16, a third exemplary structure according to a third embodiment of the present invention includes a stack of a graphene layer 30 formed by graphitization, a single crystalline semiconductor-carbon alloy layer 120, and a sapphire substrate 110 having a (0001) surface orientation. The single crystalline semiconductor-carbon alloy layer 120 has a hexagonal crystal structure, i.e., in alpha phase. The third exemplary structure is derived from the first exemplary structure by graphitizing a surface portion of the single crystalline semiconductor-carbon alloy layer 120. Specifically, the graphene layer 30 is formed directly on the top surface 21 of a remaining portion of the single crystalline semiconductor-carbon alloy layer 120 by conversion of a top layer of the single crystalline semiconductor-carbon alloy layer 120. The conversion can be effected by evaporating semiconductor atoms from the top layer at an elevated temperature, for example, from 800° C. to 2,000° C. The graphene layer 30 includes at least one graphene monolayer. The graphene layer 30 can consist of a single monolayer of graphene, or can include several monolayers of graphene that are loosely bonded between adjacent monolayers only by Van der Waals force. The graphene layer 30 is formed directly on the top surface 21 of the single crystalline semiconductor-carbon alloy layer 120, which can be a (1000) surface of a single crystalline silicon carbide layer.

The graphene layer 30 can be formed by an anneal that converts a surface layer of the single crystalline semiconductor-carbon alloy layer 120 into the graphene layer. The anneal can be performed in vacuum at an elevated temperature between 800° C. and 2,000° C., and typically between 900° C. and 1,400° C. The (1000) surface of the single crystalline semiconductor-carbon alloy layer 120 has a hexagonal symmetry, which is the same symmetry as the symmetry of the graphene layer 30.

Referring to FIG. 17, a fourth exemplary structure according to a fourth embodiment of the present invention includes a stack of a graphene layer 30 formed by graphitization, a single crystalline semiconductor-carbon alloy layer 220, and a sapphire substrate 110 having a (1102) surface orientation. The single crystalline semiconductor-carbon alloy layer 220 has a cubic crystal structure of zinc blende type, i.e., in beta phase. The fourth exemplary structure is derived from the second exemplary structure by graphitizing a surface portion of the single crystalline semiconductor-carbon alloy layer 220. Specifically, the graphene layer 30 is formed directly on the top surface 21 of a remaining portion of the single crystalline semiconductor-carbon alloy layer 220 by conversion of a top layer of the single crystalline semiconductor-carbon alloy layer 220. The conversion can be effected by evaporating semiconductor atoms from the top layer at an elevated temperature, for example, from 800° C. to 2,000° C. The graphene layer 30 includes at least one graphene monolayer. The graphene layer 30 can consist of a single monolayer of graphene, or can include several monolayers of graphene that are loosely bonded between adjacent monolayers only by Van der Waals force. The graphene layer 30 can consist of a single monolayer of graphene, or can include several monolayers of graphene that are loosely bonded between adjacent monolayers only by Van der Waals force. The graphene layer 30 is formed directly on the top surface 21 of the single crystalline semiconductor-carbon alloy layer 220, which can be a (110) surface of a single crystalline silicon carbide layer.

The graphene layer 30 can be formed by an anneal that converts a surface layer of the single crystalline semiconductor-carbon alloy layer 220 into the graphene layer. The anneal can be performed in vacuum at an elevated temperature between 800° C. and 2,000° C., and typically between 1,000° C. and 1,400° C. The graphene layer 30 can be formed despite the lack of hexagonal symmetry in the top surface 21 of the single crystalline semiconductor-carbon alloy layer 120. Formation of the graphene layer 30, which has a hexagonal symmetry within each monolayer therein, on a crystallographic surface having a non-hexagonal symmetry is not obvious because any symmetry in a surface layer generally follows the symmetry of an underlying layer. However, research leading to the instant invention has revealed that the graphene layer 30 having a hexagonal symmetry can be formed on surfaces having a non-hexagonal symmetry. Experimental data showing this phenomenon are described below.

Figure 18A:
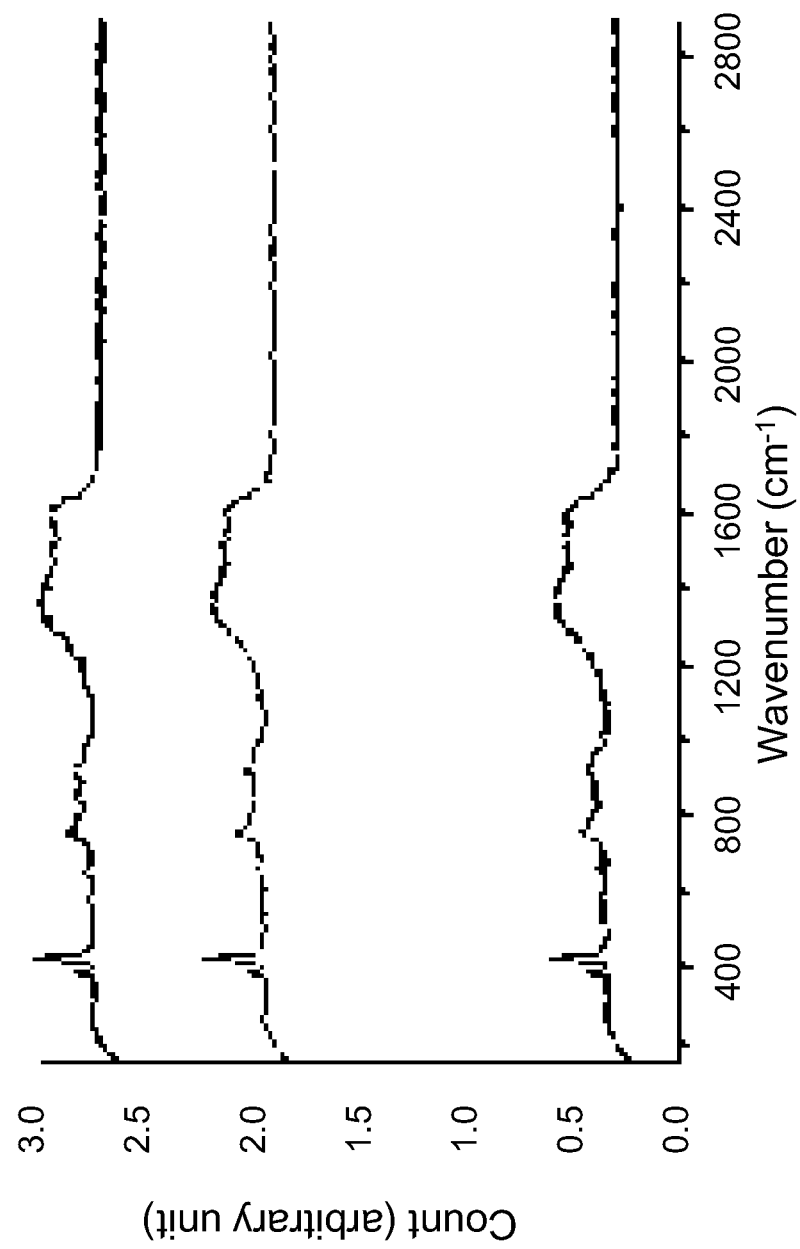
FIG. 18A shows Raman spectra of a (110) silicon carbide layer formed on a (1102) sapphire substrate. Each of the four Raman spectra corresponds to different sampling locations.

FIG. 18A shows Raman spectra from the top surface of a sample including a stack, from top to bottom, of a silicon carbide layer and a sapphire substrate according to the second embodiment of the present invention. The silicon carbide layer has a cubic crystal structure of zinc blende type in beta phase and a (110) surface orientation. The silicon carbide layer is an example of a single crystalline semiconductor-carbon alloy layer 220. Each of the four Raman spectra corresponds to different sampling locations. Each Raman spectrum in FIG. 18A is vertically shifted relative to other Raman spectra by an arbitrary amount in order to clearly show the variations in intensity as a function of wavenumber.

Figure 18B:
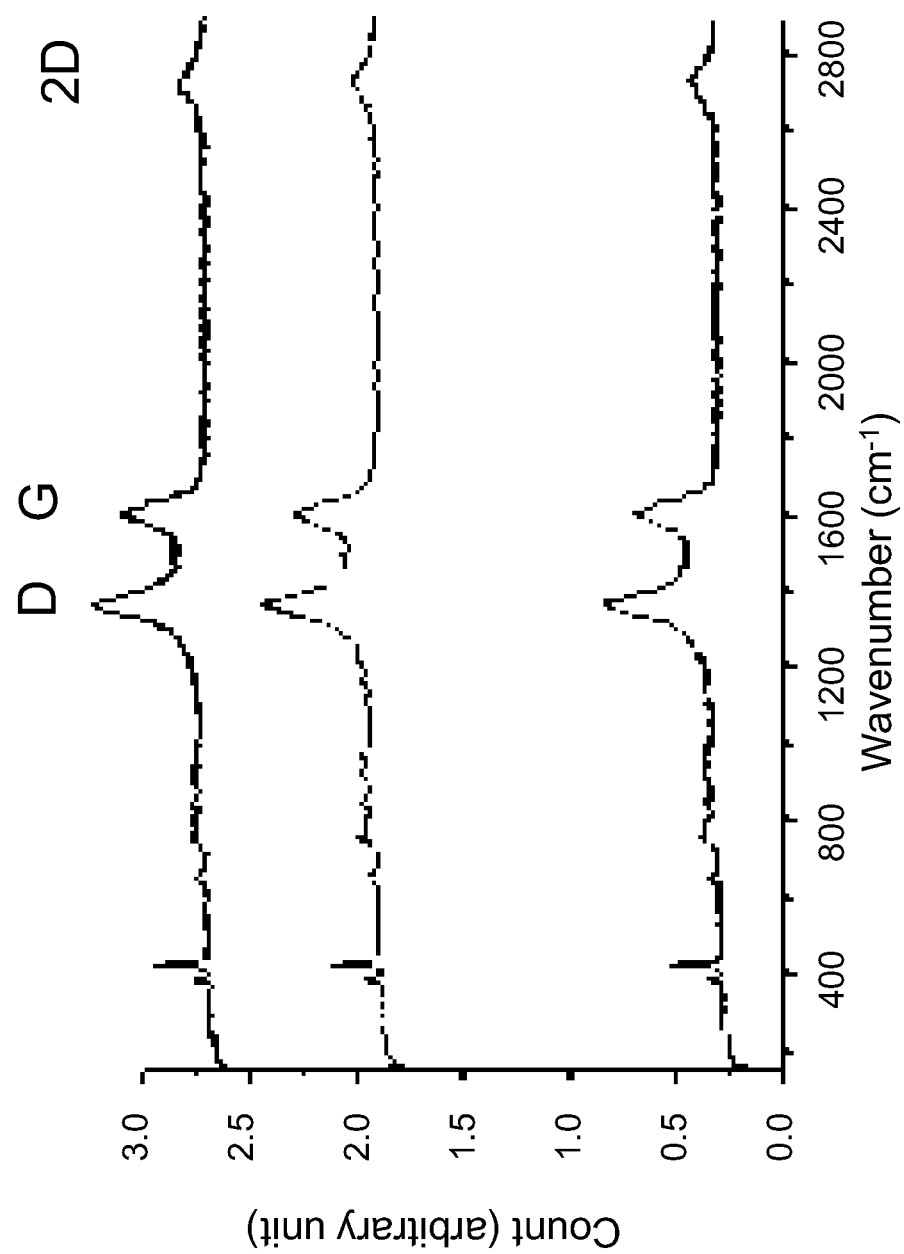
FIG. 18B shows Raman spectra of a graphene layer formed by graphitization and located on a (110) silicon carbide layer on a (1102) sapphire substrate. Each of the four Raman spectra corresponds to different sampling locations.
Figure 18C:
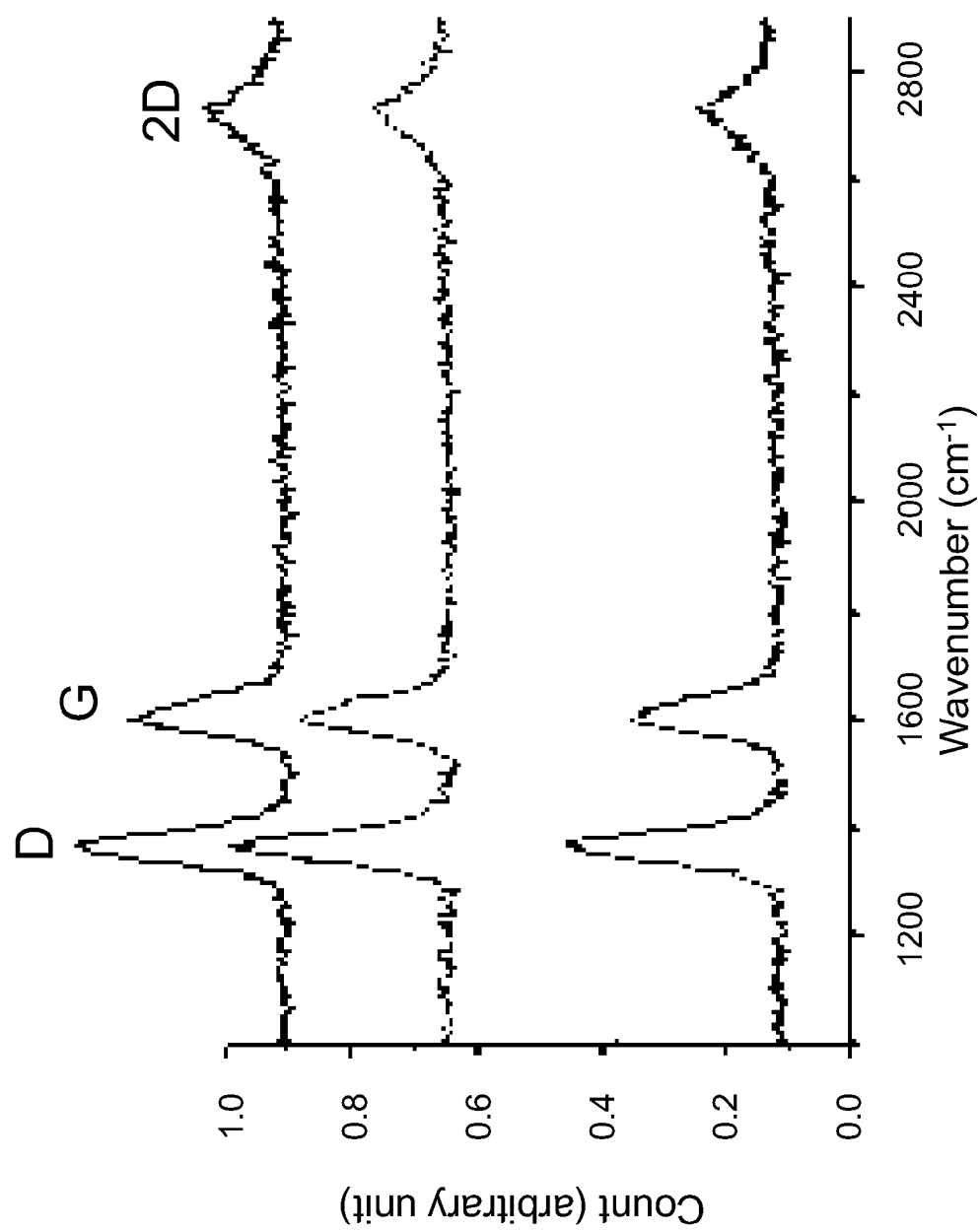
FIG. 18C is a magnified graph showing the Raman spectra of FIG. 18B.

FIGS. 18B and 19C show Raman spectra from the top surface of a sample including a stack, from top to bottom, of a graphene layer, a silicon carbide layer, and a sapphire substrate according to the fourth embodiment of the present invention. The silicon carbide layer has a cubic crystal structure of zinc blende type in beta phase and a (110) surface orientation. The sapphire substrate has a (1102) surface orientation. This sample was derived from the sample of FIG. 18A by forming a graphene layer 30 according to the fourth embodiment. Each of the four Raman spectra corresponds to different sampling locations. Each Raman spectrum in the same drawing is vertically shifted relative to other Raman spectra by an arbitrary amount in order to clearly show the variations in intensity as a function of wavenumber. The presence and the location of a D peak, a G peak, and a 2D peak in each Raman spectra show that a graphene layer is present on the top surface of the sample. Thus, a graphene layer having a hexagonal symmetry is present directly on a (110) surface of the beta phase silicon carbide layer, which is surface having a non-hexagonal symmetry.

Referring to FIG. 19, a fifth exemplary structure according to a fifth embodiment of the present invention includes a stack of a graphene layer 130 formed by deposition of carbon, a single crystalline semiconductor-carbon alloy layer 120, and a sapphire substrate 110 having a (0001) surface orientation. The single crystalline semiconductor-carbon alloy layer 120 has a hexagonal crystal structure, i.e., in alpha phase. The fifth exemplary structure is derived from the first exemplary structure by deposition of carbon atoms and a subsequent self-assembly of the carbon atoms to form the graphene layer 130 directly on the surface of the single crystalline semiconductor-carbon alloy layer 120. The graphene layer 130 includes at least one graphene monolayer. The graphene layer 130 can consist of a single monolayer of graphene, or can include several monolayers of graphene that are loosely bonded between adjacent monolayers only by Van der Waals force. The graphene layer 130 is formed directly on the top surface 21 of the single crystalline semiconductor-carbon alloy layer 120, which can be a (1000) surface of a single crystalline silicon carbide layer. Because a graphene layer 130 formed by deposition of carbon atoms in the fifth embodiment and a self-assembly is structurally the same as a graphene layer 30 formed by graphitization in the third embodiment, the fifth exemplary structure is structurally identical with the third exemplary structure despite the differences in the methods of fabrication.

The graphene layer 130 is formed by deposition of carbon employing a chemical vapor deposition process, in which a carbon-containing precursor is decomposed in a process chamber. The deposition can be performed in vacuum at an elevated temperature between 800° C. and 2,000° C., and typically between 1,000° C. and 1,400° C. In one embodiment, the process chamber is an ultrahigh vacuum chamber with a base pressure less than $1.0 \times 10^{-6}$ Torr. The carbon-containing precursor can be selected from $C_2H_2$, $C_2H_4$, $C_nH_{2n-2}$, and $C_nH_{2n}$, wherein n is an integer greater than 2. The (1000) surface of the single crystalline semiconductor-carbon alloy layer 120 has a hexagonal symmetry, which is the same symmetry as the symmetry of the graphene layer 30.

Referring to FIG. 20, a sixth exemplary structure according to a sixth embodiment of the present invention includes a stack of a graphene layer 130 formed by deposition of carbon, a single crystalline semiconductor-carbon alloy layer 220, and a sapphire substrate 210 having a (0001) surface orientation. The single crystalline semiconductor-carbon alloy layer 220 has a cubic crystal structure of zinc blende type, i.e., in beta phase. The sixth exemplary structure is derived from the second exemplary structure by deposition of carbon atoms and a subsequent self-assembly of the carbon atoms to form the graphene layer 130 directly on the surface of the single crystalline semiconductor-carbon alloy layer 220. The graphene layer 130 includes at least one graphene monolayer. The graphene layer 130 can consist of a single monolayer of graphene, or can include several monolayers of graphene that are loosely bonded between adjacent monolayers only by Van der Waals force. The graphene layer 130 is formed directly on the top surface 21 of the single crystalline semiconductor-carbon alloy layer 220, which can be a (110) surface of a single crystalline silicon carbide layer. Because a graphene layer 130 formed by deposition of carbon atoms in the sixth embodiment and a self-assembly is structurally the same as a graphene layer 30 formed by graphitization in the fourth embodiment, the sixth exemplary structure is structurally identical with the fourth exemplary structure despite the differences in the methods of fabrication.

The graphene layer 130 is formed by deposition of carbon employing a chemical vapor deposition process, in which a carbon-containing precursor is decomposed in a process chamber. The deposition process can be the same as in the fifth embodiment. The graphene layer 130 can be formed despite the lack of hexagonal symmetry in the top surface 21 of the single crystalline semiconductor-carbon alloy layer 220.

Research leading to the instant invention has revealed that the graphene layer having a hexagonal symmetry can be formed on surfaces having a non-hexagonal symmetry. Experimental data showing this phenomenon are described below. While an anneal process forms a graphene layer by evaporation of semiconductor atoms from a semiconductor carbide layer to provide a layer of carbon, formation of the graphene layer 130 by deposition of carbon differs from the anneal method only by the source of the carbon atoms. Since the underlying mechanism for formation of a graphene layer on a non-hexagonal surface is the same irrespective of the source of carbon, demonstration of formation of a graphene layer by an anneal on a non-hexagonal surface of a single crystalline silicon carbide layer in combination with demonstration of formation of a graphene layer by deposition of carbon in a chemical vapor deposition process on the surface of a sapphire substrate shows the feasibility of formation of the graphene layer on a non-hexagonal surface of a single crystalline silicon carbide layer.

Figure 21A:
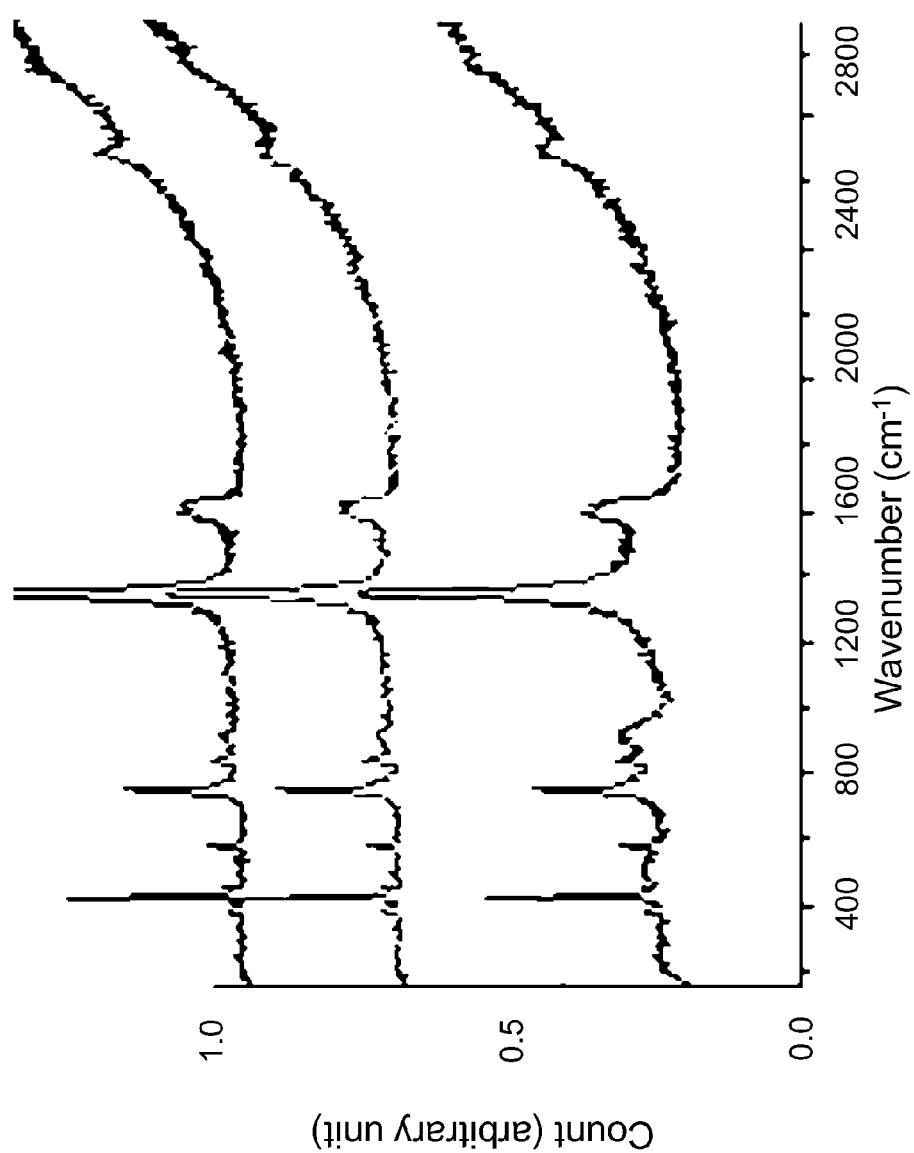
FIG. 21A shows Raman spectra of a silicon carbide layer formed on a sapphire substrate. Each of the four Raman spectra corresponds to different sampling locations.

FIG. 21A shows Raman spectra from the top surface of a sample including a stack, from top to bottom, of a silicon carbide layer and a sapphire substrate according to the first embodiment of the present invention. The silicon carbide layer has a hexagonal crystal structure in alpha phase and a (0001) surface orientation. The silicon carbide layer is an example of a single crystalline semiconductor-carbon alloy layer 120. Each of the four Raman spectra corresponds to different sampling locations. Each Raman spectrum in FIG. 21A is vertically shifted relative to other Raman spectra by an arbitrary amount in order to clearly show the variations in intensity as a function of wavenumber.

Figure 21B:
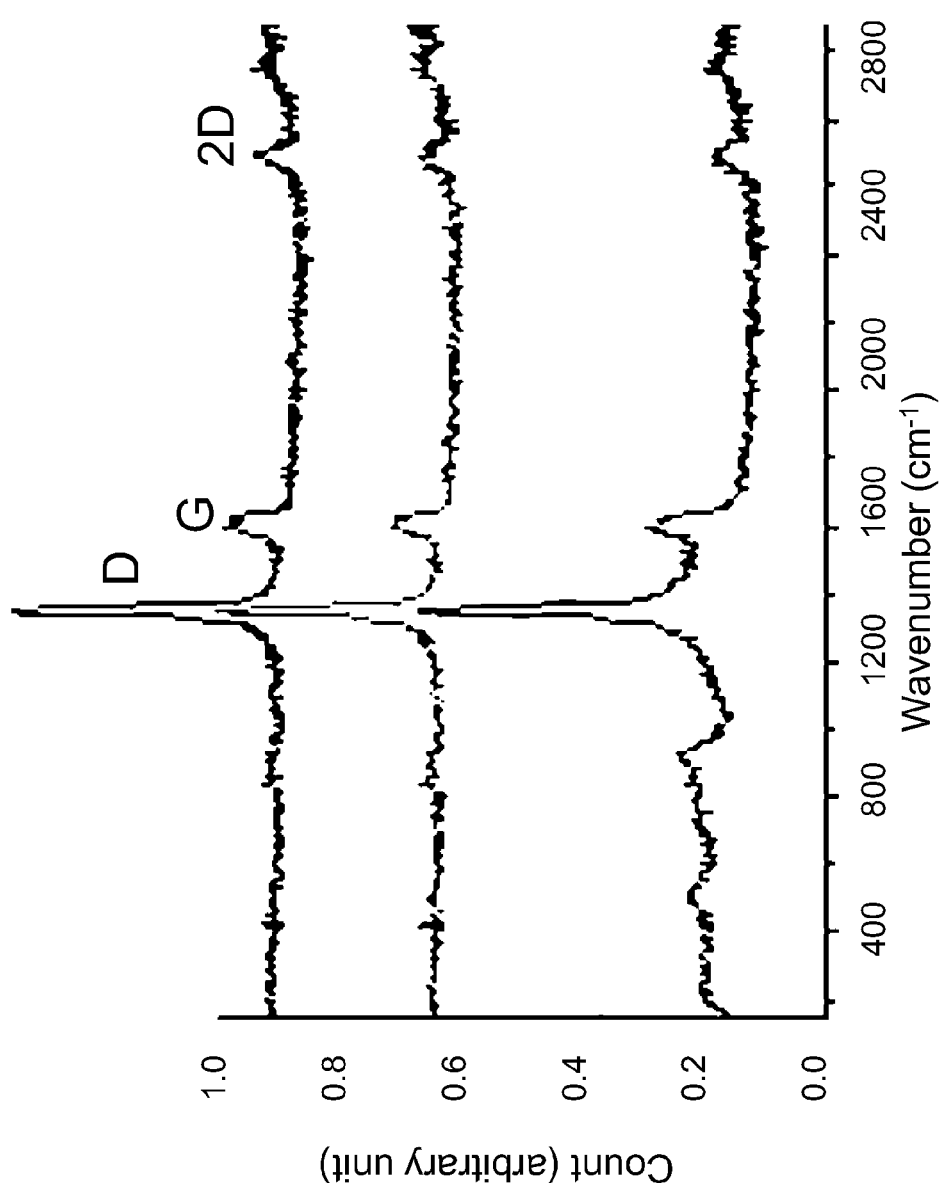
FIG. 21B shows Raman spectra of a graphene layer formed by deposition of carbon and located on a silicon carbide layer. Each of the four Raman spectra corresponds to different sampling locations.
Figure 21C:
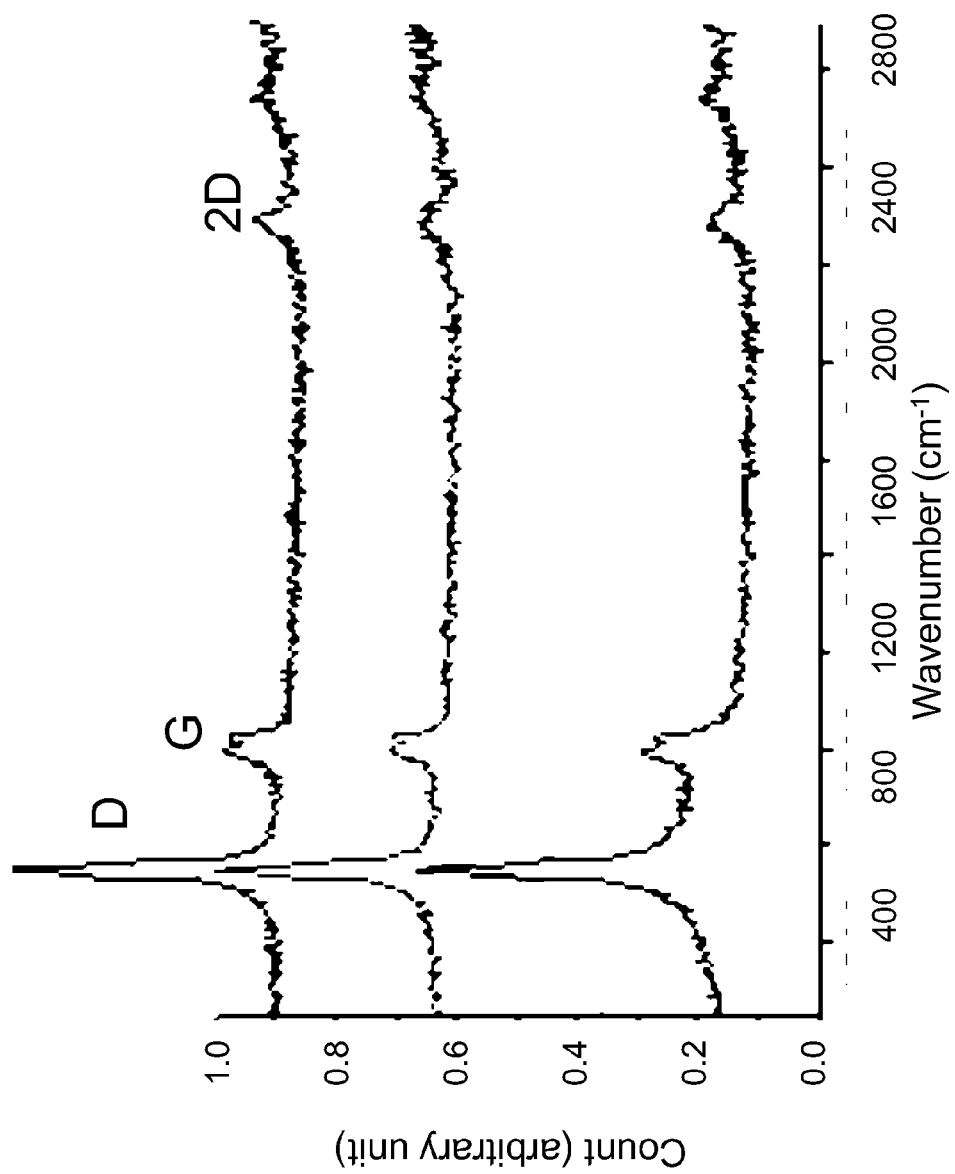
FIG. 21C is a magnified graph showing the Raman spectra of FIG. 21B.

FIGS. 21B and 21C show Raman spectra from the top surface of a sample including a stack, from top to bottom, of a graphene layer, a silicon carbide layer, and a sapphire substrate according to the fifth embodiment of the present invention. The silicon carbide layer has a hexagonal crystal structure in alpha phase and a (0001) surface orientation. The sapphire substrate has a (0001) surface orientation. This sample was derived from the sample of FIG. 21A by forming a graphene layer 130 according to the fifth embodiment. Each of the four Raman spectra corresponds to different sampling locations. Each Raman spectrum in the same drawing is vertically shifted relative to other Raman spectra by an arbitrary amount in order to clearly show the variations in intensity as a function of wavenumber. The presence and the location of a D peak, a G peak, and a 2D peak in each Raman spectra show that a graphene layer is present on the top surface of the sample. Thus, a graphene layer having a hexagonal symmetry is present directly on a (110) surface of the beta phase silicon carbide layer, which is surface having a non-hexagonal symmetry.

Figure 22:
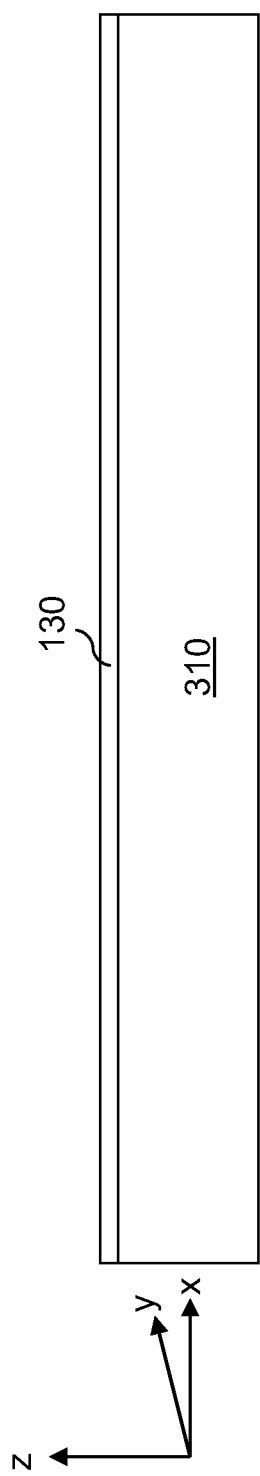
FIG. 22 is a vertical cross-sectional view of a seventh exemplary structure including a sapphire substrate and a graphene layer deposited thereupon.

Referring to FIG. 22, a seventh exemplary structure according to a seventh embodiment of the present invention includes a sapphire substrate 310 and a graphene layer deposited thereupon. The surface of the sapphire substrate 310 is cleaned by at least one wet clean, followed by a degassing at an elevated temperature from 400° C. to 1,000° C.

The graphene layer 130 is formed by deposition of carbon employing a chemical vapor deposition process, in which a carbon-containing precursor is decomposed in a process chamber. The deposition can be performed in vacuum at an elevated temperature between 800° C. and 2,000° C., and typically between 1,000° C. and 1,400° C. In one embodiment, the process chamber is an ultrahigh vacuum chamber with a base pressure less than $1.0 \times 10^{-6}$ Torr. The carbon-containing precursor can be selected from $C_2H_2$, $C_2H_4$, $C_nH_{2n-2}$, and $C_nH_{2n}$, wherein n is an integer greater than 2.

Figure 23:
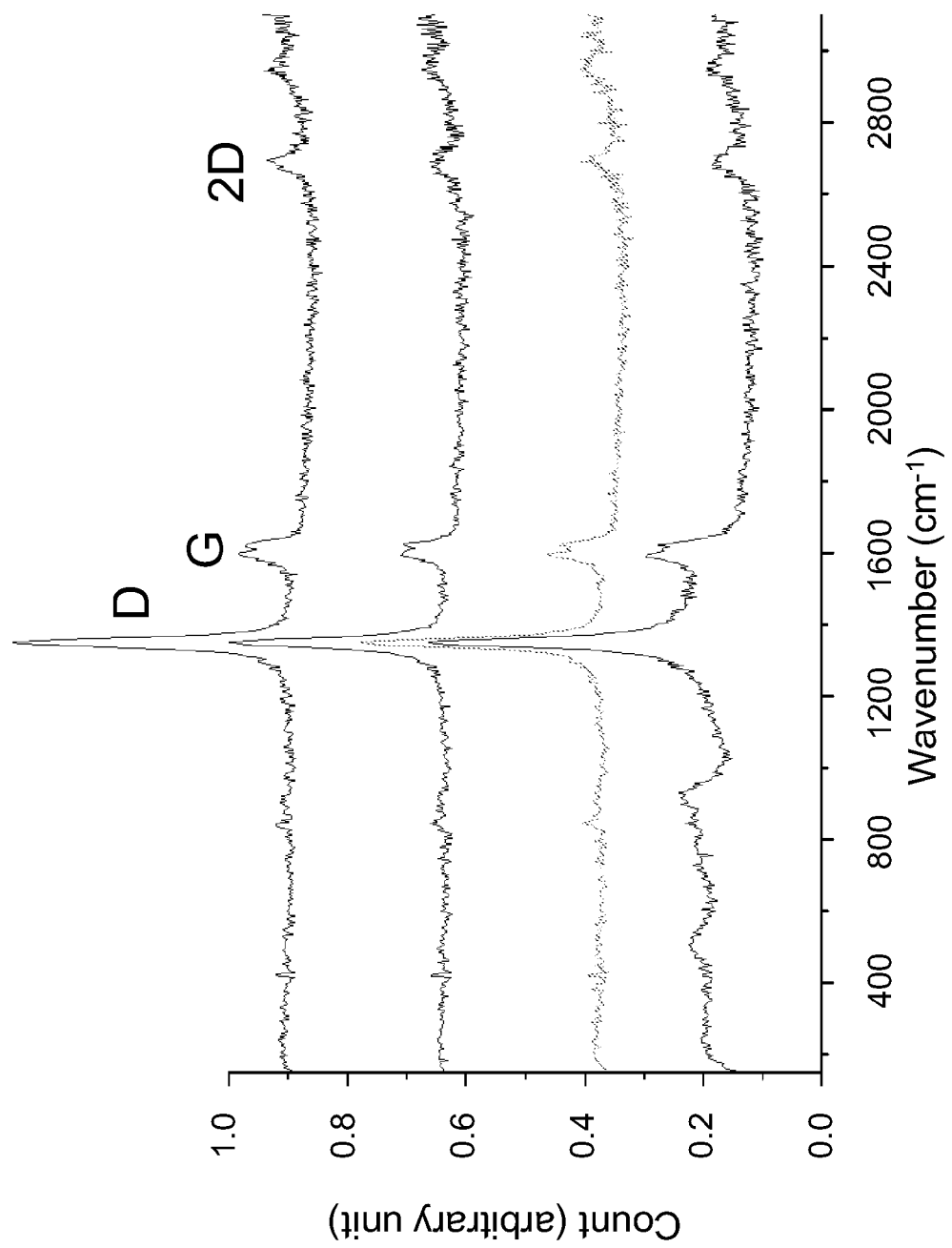
FIG. 23 shows Raman spectra of a graphene layer formed by deposition of carbon and located on a sapphire substrate. Each of the four Raman spectra corresponds to different sampling locations.

FIG. 23 shows Raman spectra from a top surface of sample, which includes a graphene layer formed by deposition of carbon directly on a (0001) sapphire substrate. Each of the four Raman spectra corresponds to different sampling locations. Each Raman spectrum in the same drawing is vertically shifted relative to other Raman spectra by an arbitrary amount in order to clearly show the variations in intensity as a function of wavenumber. The presence and the location of a D peak, a G peak, and a 2D peak in each Raman spectra show that a graphene layer is present on the top surface of the sample. Thus, a graphene layer having a hexagonal symmetry is present directly on a (110) surface of the beta phase silicon carbide layer, which is surface having a non-hexagonal symmetry. The Raman spectra show that deposition of a graphene layer directly on the (0001) surface of a single crystalline sapphire substrate is possible.

Figure 24:
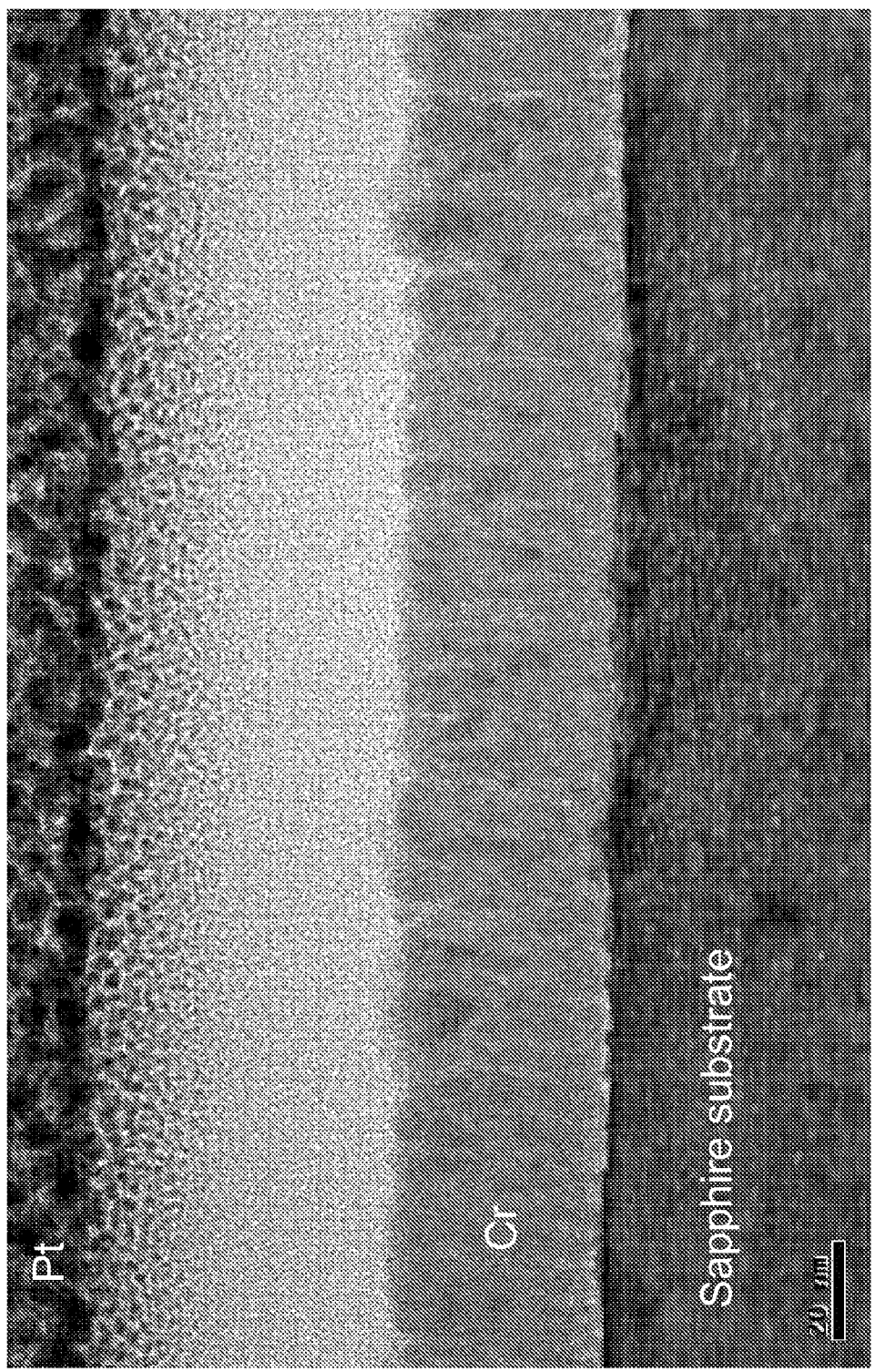
FIG. 24 shows a transmission electron microscopy (TEM) picture of a sample including a graphene layer formed by deposition of carbon and located on a sapphire substrate.

FIG. 24 shows a transmission electron microscopy (TEM) picture of the sample of FIG. 23. After deposition of the graphene layer on the top surface of a (0001) sapphire substrate, a chromium layer and a platinum layer were deposited to prepare a portion of the sample for TEM analysis. Absence of any agglomerated structure between the sapphire substrate and the chromium layer shows that the graphene layer is formed as a two-dimensional structure without forming islands during nucleation.

Referring to FIG. 25, an eighth exemplary structure according to an eighth embodiment of the present invention includes a single crystalline semiconductor-carbon alloy layer 320. A top surface 21 of the single crystalline semiconductor-carbon alloy layer 320 is a crystallographic surface that has a non-hexagonal symmetry, i.e., a symmetry other than a hexagonal symmetry. Exemplary non-hexagonal symmetries include cubic symmetry, tetragonal symmetry, rhombohedral symmetry, orthorhombic symmetry, monoclinic symmetry, and triclinic symmetry. Thus, the periodic structure of the top surface 21 of the single crystalline semiconductor-carbon alloy layer 320 is not invariant under a 60 degree rotation around the z-axis, i.e., an axis perpendicular to the top surface 21 of the single crystalline semiconductor-carbon alloy layer 320. The periodic structure of the top surface 21 may, or may not be invariant under rotation around the z-axis by an angle other than 60 degrees. For example, the periodic structure of the top surface 21 may be invariant under rotation around the axis perpendicular to the top surface 21 of the single crystalline semiconductor-carbon alloy layer 320 by 90 degrees or 180 degrees. Further, the periodic structure of the top surface 21 may be invariant under translation along at least two independent directions that are parallel to the top surface 21 of the single crystalline semiconductor-carbon alloy layer 320.

The single crystalline semiconductor-carbon alloy layer 320 is a single crystalline layer in which all atoms are epitaxially aligned to all other atoms of the single crystalline semiconductor-carbon alloy layer 320 except for naturally present imperfections in the crystal lattice structure such as dislocations and/or point defects. Point defects can be substitutional defects or interstitial defects as known in the art.

In a first illustrative example, the single crystalline semiconductor-carbon alloy layer 320 can be a layer of a silicon-carbon alloy. Carbon has an atomic concentration from 20% to 75% in the silicon-carbon alloy, and preferably has an atomic composition from 45% to 55% in the silicon-carbon alloy.

In a second illustrative example, the single crystalline semiconductor-carbon alloy layer 320 can be a layer of a silicon-germanium-carbon alloy. Carbon has an atomic concentration from 20% to 75% in the silicon-germanium-carbon alloy, and preferably has an atomic composition from 45% to 55% in the silicon-germanium-carbon alloy.

In a third illustrative example, the single crystalline semiconductor-carbon alloy layer 320 can be a layer of a germanium-carbon alloy. Carbon has an atomic concentration from 20% to 75% in the germanium-carbon alloy, and preferably has an atomic composition from 45% to 55% in the germanium-carbon alloy.

In a fourth illustrative example, the single crystalline semiconductor-carbon alloy layer 320 can be a superlattice including multiple repetitions of a first material layer and a second material layer. At least one of the first material layer and a second material layer includes carbon and at least one of the first material layer and a second material layer includes at least one of silicon and germanium. The first material layer may include silicon, germanium, or an alloy of silicon and the second material layer may include carbon or a carbon alloy. An exemplary combination of the first material layer and the second material layer is a silicon layer and a carbon layer. Another exemplary combination of the first material layer is a silicon boride layer and a carbon layer.

In some cases, the top surface 21 of the single crystalline semiconductor-carbon alloy layer 320 can have a rectangular symmetry. The single crystalline semiconductor-carbon alloy layer 320 can be a single crystalline semiconductor carbide layer such as a single crystalline silicon carbide layer.

In one case, the top surface 21 of the single crystalline semiconductor-carbon alloy layer 320 can be a non-hexagonal surface of a single crystalline silicon carbide layer in alpha phase, which is a hexagonal crystal structure phase of silicon carbide. In this case, all crystallographic surfaces other than (0001) surfaces of the single crystalline silicon carbide layer in alpha phase are surfaces having a non-hexagonal symmetry.

In another case, the top surface 21 of the single crystalline semiconductor-carbon alloy layer 320 can be a non-hexagonal surface of a single crystalline silicon carbide layer in beta phase, which is a cubic crystal structure of zinc blende type. In this case, all crystallographic surfaces other than (111) surfaces of the single crystalline silicon carbide layer in beta phase are surfaces having a non-hexagonal symmetry. For example, the top surface 21 of the single crystalline semiconductor-carbon alloy layer 320 can be a (100) surface of the single crystalline silicon carbide layer in beta phase.

A graphene layer 130 is formed directly on the top surface 21 of the single crystalline semiconductor-carbon alloy layer 320. The graphene layer 130 includes at least one graphene monolayer. The graphene layer 130 can consist of a single monolayer of graphene, or can include several monolayers of graphene that are loosely bonded between adjacent monolayers only by Van der Waals force. The graphene layer 130 is formed directly on the top surface 21 of the single crystalline semiconductor-carbon alloy layer 320, which is a crystallographic surface having a non-hexagonal symmetry. For example, in case the top surface 21 of the single crystalline semiconductor-carbon alloy layer 320 is a (100) surface of a single crystalline silicon carbide layer in beta phase, the graphene layer 130 contacts a (100) surface of the single crystalline silicon carbide layer in the beta phase.

The graphene layer 130 is formed by deposition of carbon employing a chemical vapor deposition process, in which a carbon-containing precursor is decomposed in a process chamber. The deposition can be performed in vacuum at an elevated temperature between 800° C. and 2,000° C., and typically between 1,000° C. and 1,400° C. In one embodiment, the process chamber is an ultrahigh vacuum chamber with a base pressure less than $1.0 \times 10^{-6}$ Torr. The carbon-containing precursor can be selected from $C_2H_2$, $C_2H_4$, $C_nH_{2n-2}$, and $C_nH_{2n}$, wherein n is an integer greater than 2.

The feasibility of formation of the graphene layer by deposition of a carbon-containing precursor has been indirectly demonstrated by formation of a graphene layer on the same type of substrate by an anneal. Research leading to the instant invention has revealed that the graphene layer having a hexagonal symmetry can be formed on surfaces having a non-hexagonal symmetry. Experimental data showing this phenomenon are described below. While an anneal process forms a graphene layer by evaporation of semiconductor atoms from a semiconductor carbide layer to provide a layer of carbon, formation of the graphene layer 130 by deposition of carbon differs from the anneal method only by the source of the carbon atoms. Since the underlying mechanism for formation of a graphene layer on a non-hexagonal surface is the same irrespective of the source of carbon, demonstration of formation of a graphene layer by an anneal on a non-hexagonal surface of a single crystalline silicon carbide layer in combination with demonstration of formation of a graphene layer by deposition of carbon in a chemical vapor deposition process on the surface of a sapphire substrate shows the feasibility of formation of the graphene layer on a non-hexagonal surface of a single crystalline silicon carbide layer.

Referring to FIG. 26, a ninth exemplary structure according to a ninth embodiment of the present invention includes a semiconductor substrate 410 and a single crystalline semiconductor-carbon alloy layer 320. The single crystalline semiconductor-carbon alloy layer 320 is formed by depositing a semiconductor-carbon alloy material directly on the semiconductor substrate 410 by epitaxy. Thus, the atoms in the single crystalline semiconductor-carbon alloy layer 320 are epitaxially aligned to the atoms of the semiconductor substrate 410. The epitaxy of the semiconductor-carbon alloy material can be deposited on the semiconductor substrate 410, for example, by chemical vapor deposition (CVD), molecular beam epitaxy (MBE), and/or atomic layer deposition (ALD).

The composition and the crystallographic orientations of the semiconductor substrate 410 are selected so that the top surface of the single crystalline semiconductor-carbon alloy layer 320 has a crystallographic surface having a non-hexagonal symmetry as in the first exemplary structure. The composition and crystallographic orientations of the single crystalline semiconductor-carbon alloy layer 320 can be the same as in the first exemplary structure.

For example, the top surface 21 of the single crystalline semiconductor-carbon alloy layer 320 can have a rectangular symmetry. The single crystalline semiconductor-carbon alloy layer 320 can be a single crystalline semiconductor carbide layer such as a single crystalline silicon carbide layer as discussed above.

In one case, the top surface 21 of the single crystalline semiconductor-carbon alloy layer 320 can be a non-hexagonal surface of a single crystalline silicon carbide layer in alpha phase, which is a hexagonal crystal structure phase of silicon carbide. In this case, all crystallographic surfaces other than (0001) surfaces of the single crystalline silicon carbide layer in alpha phase are surfaces having a non-hexagonal symmetry.

In another case, the top surface 21 of the single crystalline semiconductor-carbon alloy layer 320 can be a non-hexagonal surface of a single crystalline silicon carbide layer in beta phase, which is a cubic crystal structure of zinc blende type. In this case, all crystallographic surfaces other than (111) surfaces of the single crystalline silicon carbide layer in beta phase are surfaces having a non-hexagonal symmetry. If the semiconductor substrate 410 is a single crystal silicon layer, the top surface 21 of the single crystalline semiconductor-carbon alloy layer 320 can be a (100) surface of the single crystalline silicon carbide layer in beta phase, and the single crystalline silicon carbide layer can be formed directly on a (100) surface of the single crystalline silicon layer.

A graphene layer 130 can be formed directly on the top surface 21 of the single crystalline semiconductor-carbon alloy layer 320, which is a crystallographic surface having a non-hexagonal symmetry. The graphene layer 130 is the same as in the eighth embodiment, and can be formed by employing the same method. Because of the presence of the semiconductor substrate 410, however, the temperature range at which the anneal can be performed to form the graphene layer is limited below the melting temperature of the semiconductor substrate 410.

In an experiment, formation of a graphene layer on a (110) surface of a silicon carbide layer located on a (100) silicon layer was experimentally fabricated and tested. In this experiment, a stack of the single crystalline beta phase silicon carbide layer and the (100) silicon layer was placed in a vacuum environment. The beta phase silicon carbide layer had an exposed (110) surface, which was parallel to the top surface of the (100) silicon substrate. The exposed surface of the single crystalline beta phase silicon carbide layer was degassed for about 28 minutes at about 810° C. in order to evaporate impurity atoms from the surface of the single crystalline beta phase silicon carbide layer. The background pressure of the vacuum environment was maintained below $1.0 \times 10^{-7}$ Torr during the degassing. 20% disilane ($Si_2H_6$) gas with He balance gas was introduced into the vacuum environment for about 10 minutes while maintaining a total pressure of about $3.0 \times 10^{-7}$ Torr and a constant temperature about 810° C. The disilane gas is a reducing agent intended to remove any oxidized material from the surface of the single crystalline beta phase silicon carbide layer.

Once the disilane gas was turned off, the system was pumped down to a base pressure below $1.0 \times 10^{-8}$ Torr, and the sample was annealed at a temperature of 1,300° C. This anneal graphitized the top surface of the single crystalline beta phase silicon carbide layer, and formed a graphene layer 30 having a hexagonal symmetry although the top surface of the single crystalline beta phase silicon carbide layer was a (100) surface having a rectangular symmetry.

Figure 27A:
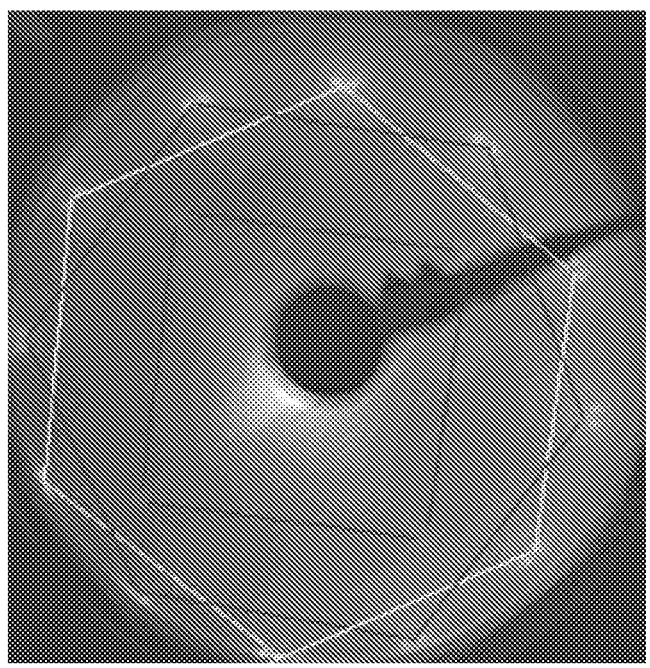
FIG. 27A is a low energy electron diffraction (LEED) image of a graphene layer on a (100) surface of a silicon carbide layer having a cubic crystal symmetry.
Figure 27B:
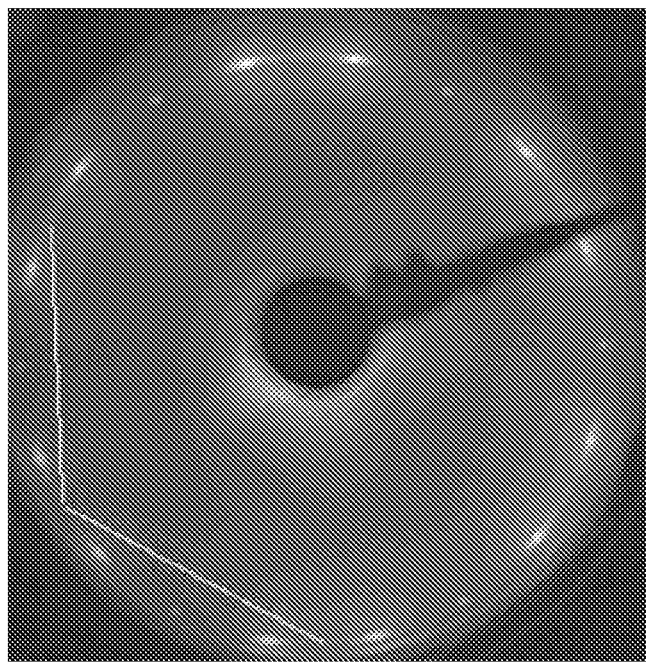
FIG. 27B is a low energy electron diffraction (LEED) image of a graphene layer on a (0001) surface of a silicon carbide layer having a hexagonal crystal symmetry.

Low energy electron diffraction (LEED) data showed that a graphene layer is present on the surface of this sample. FIG. 27A shows a LEED image of the graphene layer in this sample. The graphene layer is formed directly on the (100) surface of the single crystalline beta phase silicon carbide layer, which is a silicon carbide layer having a cubic crystal symmetry. Comparison of FIG. 27A with FIG. 27B, which is a LEED image of a graphene layer on a (0001) surface of a silicon carbide layer having a hexagonal crystal symmetry, shows that the same type of crystal symmetry is observed in FIG. 27A as in FIG. 27B. This points to the presence of the graphene layer on the (100) surface of the single crystalline beta phase silicon carbide layer in the sample.

Figure 28A:
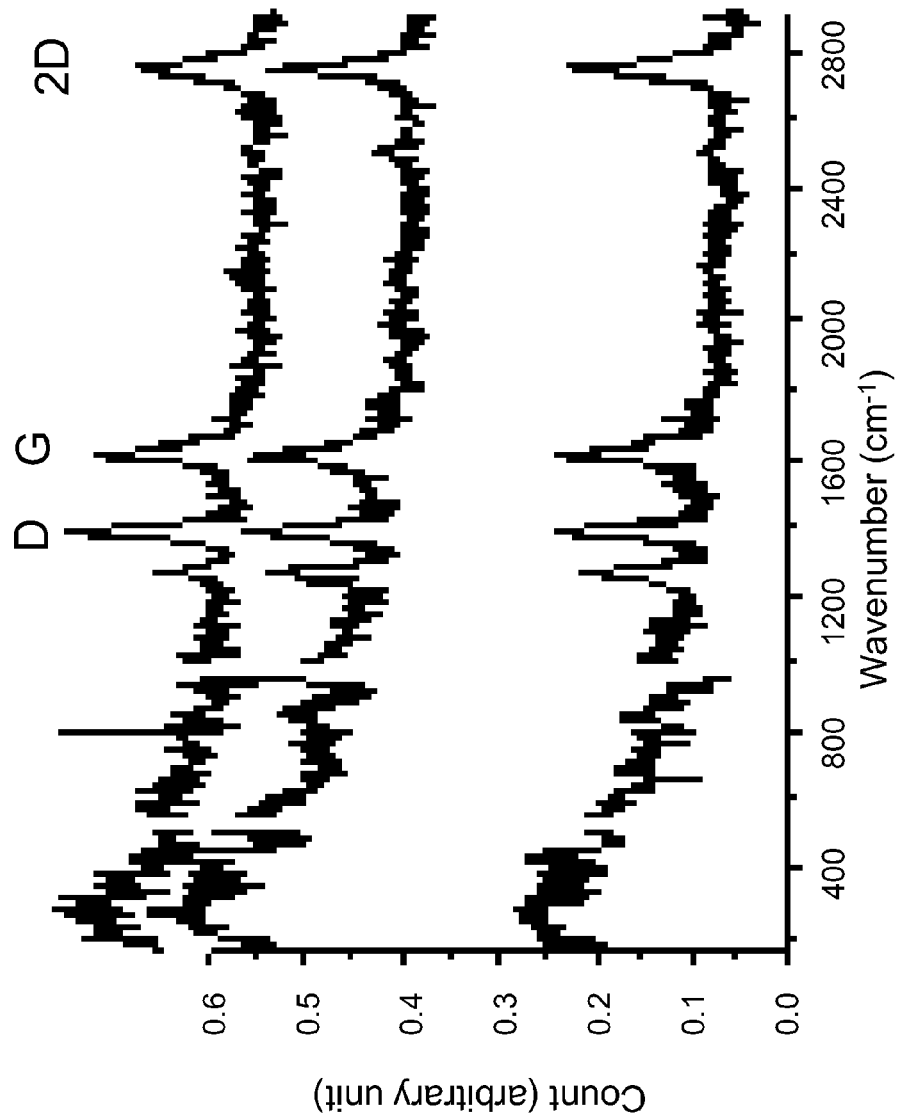
FIGS. 28A-28C are Raman spectra of a graphene layer on a (100) surface of a silicon carbide layer having a cubic crystal symmetry. Each of the twelve Raman spectra corresponds to different sampling locations.
Figure 28B:
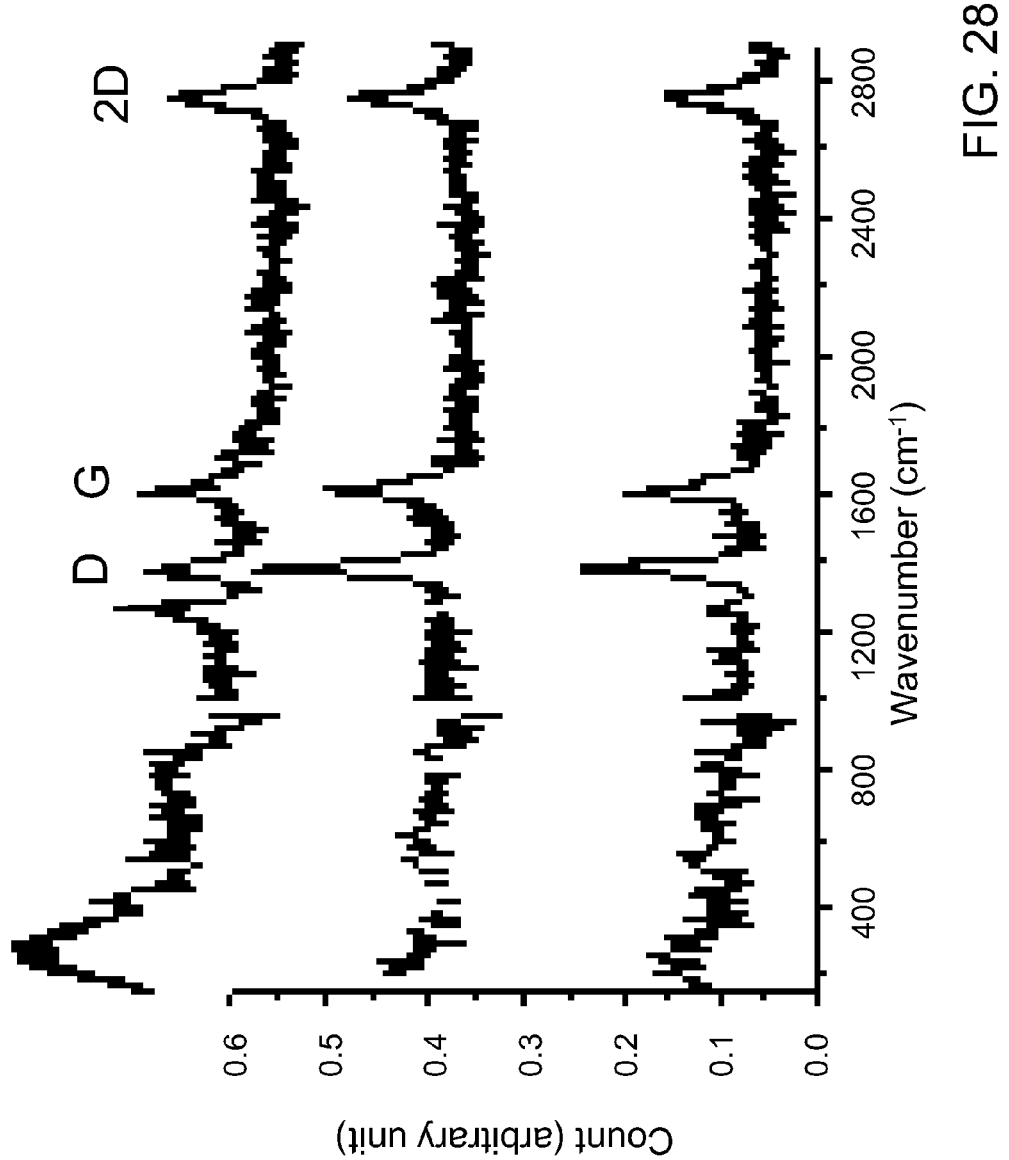
Figure 28C:
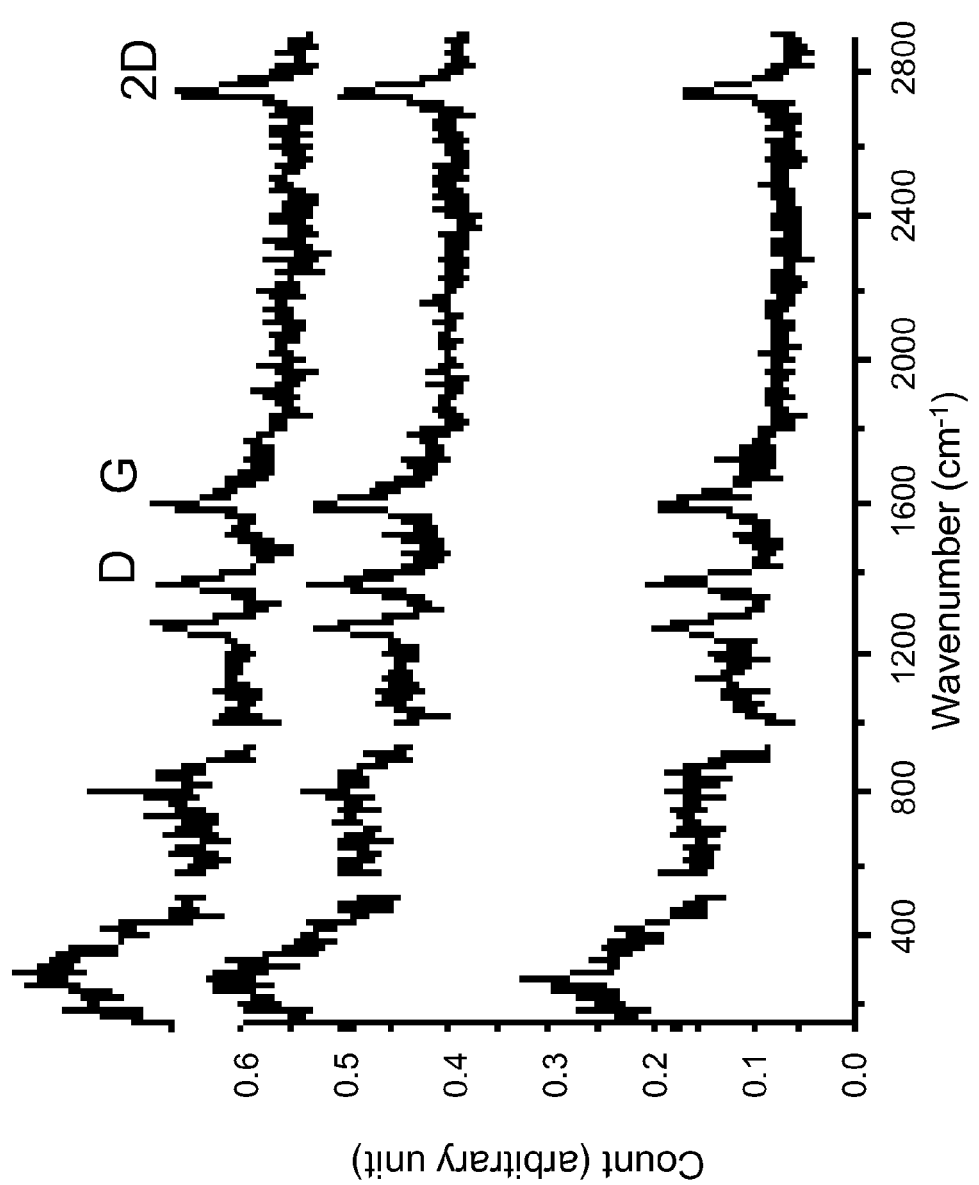

Raman spectra data also shows the presence of the graphene layer on the surface of the sample. FIGS. 28A-28C are Raman spectra of a graphene layer on a (100) surface of a silicon carbide layer having a cubic crystal symmetry. Each of the twelve Raman spectra corresponds to different sampling locations. Each Raman spectrum in the same drawing is vertically shifted relative to other Raman spectra by an arbitrary amount in order to clearly show the variations in intensity as a function of wavenumber.

Graphene is known to have three prominent Raman peaks, which include a G peak around 1580 cm$^{-1}$, a D peak around 1350 cm$^{-1}$, and a 2D peak around 2700 cm$^{-1}$. The G peak is due to double degeneracy at the center of the Brillouin zone, the D peak is due to defect mediated zone-edge phonons near the K-point of the Brillouin zone, and the 2D peak is due to second order double resonant Raman scattering from a zone boundary. All three peaks are visible in each Raman spectra, confirming the presence of the graphene layer on the (100) surface of the single crystalline beta phase silicon carbide layer.

Figure 29B:
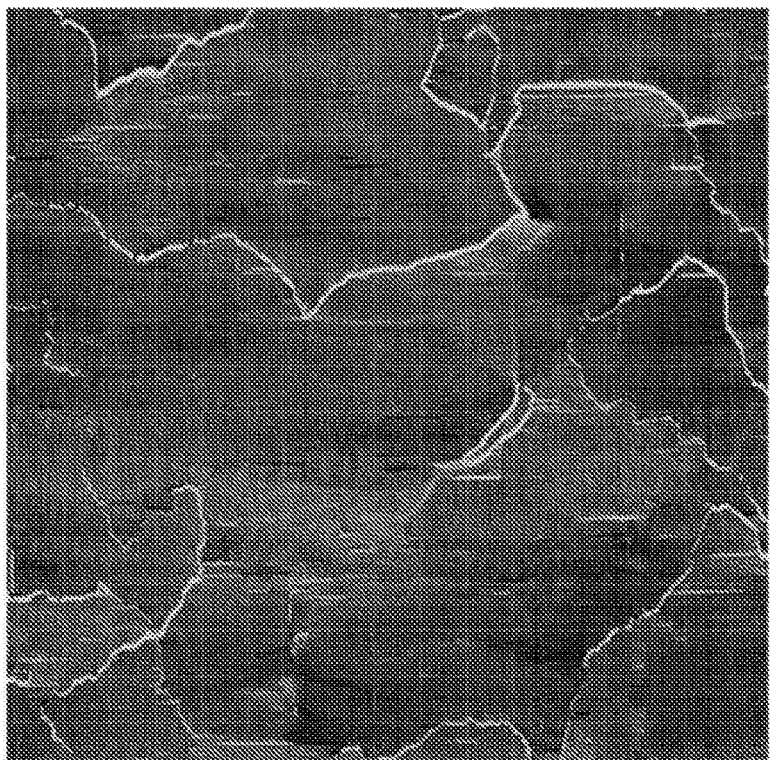
FIG. 29B is an image from a phase scan of the (100) surface of the silicon carbide layer having a cubic crystal symmetry over the 20 microns×20 microns area of FIG. 9A before formation of a graphene layer employing the atomic force microscopy (AFM) probe.
Figure 29A:
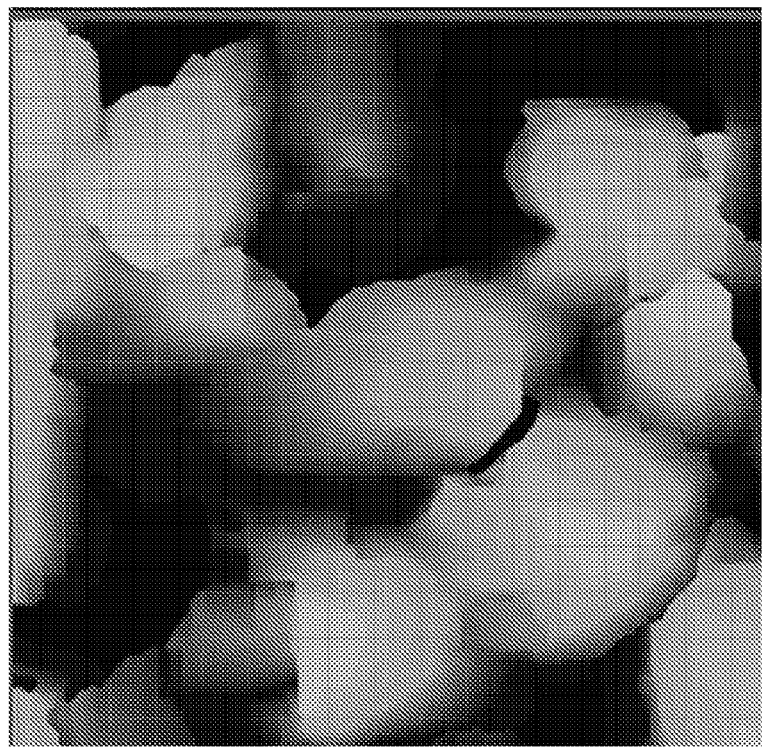
FIG. 29A is an image from a height scan of a (100) surface of a silicon carbide layer having a cubic crystal symmetry over an area of 20 microns×20 microns before formation of a graphene layer employing an atomic force microscopy (AFM) probe.
Figure 30B:
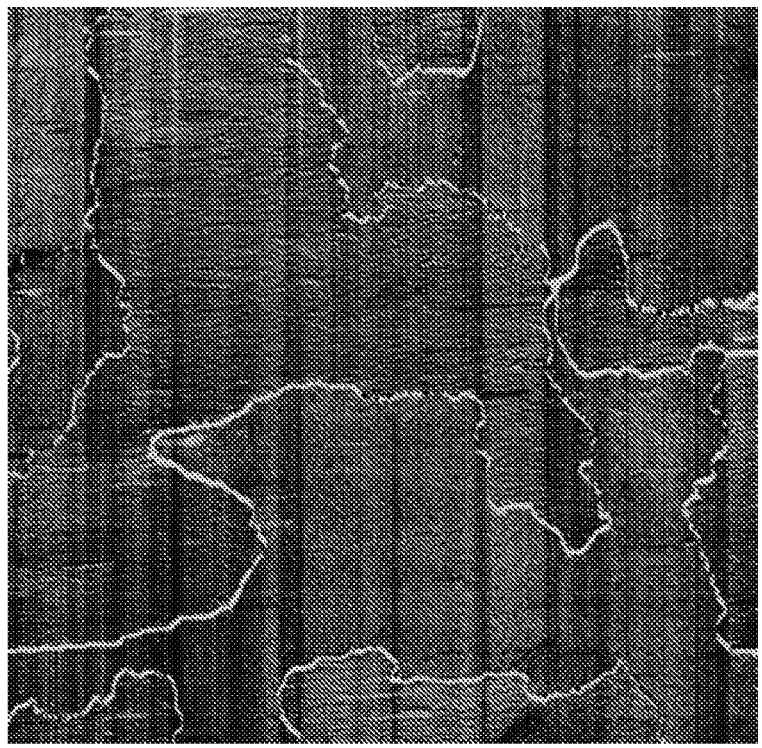
FIG. 30B is an image from a phase scan of the graphene layer on the (100) surface of the silicon carbide layer having a cubic crystal symmetry over the 20 microns×20 microns area of FIG. 9A employing the atomic force microscopy (AFM) probe.
Figure 30A:
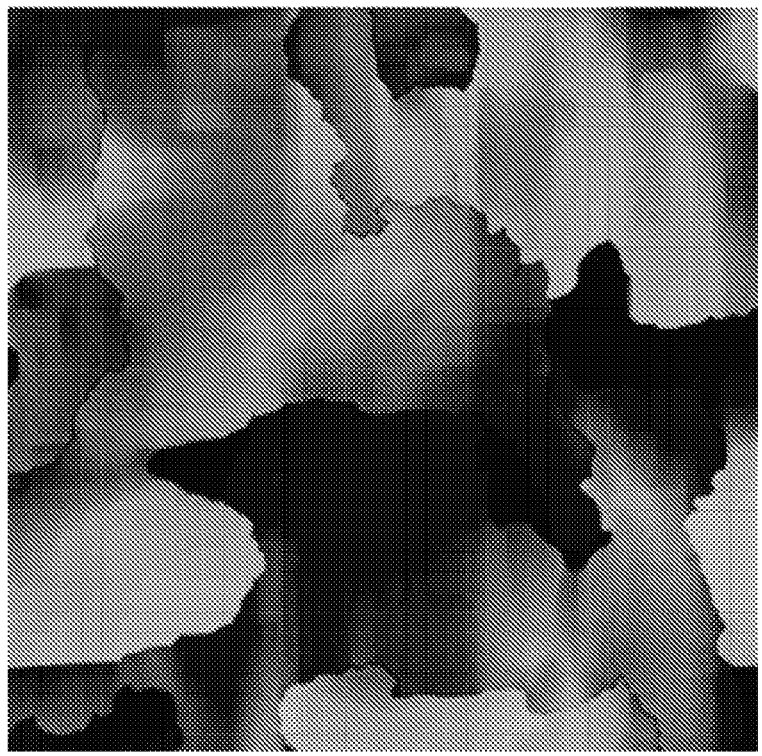
FIG. 30A is an image from a height scan of a graphene layer on a (100) surface of a silicon carbide layer having a cubic crystal symmetry over an area of 20 microns×20 microns employing an atomic force microscopy (AFM) probe.

FIG. 29A is an image from a height scan of a (100) surface of the single crystalline beta phase silicon carbide layer of the sample over an area of 20 microns×20 microns as generated by an atomic force microscopy (AFM) probe. FIG. 29B is a corresponding phase scan of the (100) surface of the silicon carbide layer of the sample. Thus, the images in FIGS. 29A and 29B were generated before formation of the graphene layer. The images of FIGS. 29A and 29B were generated concurrently by the same scan of the AFM probe, but the data was subsequently processed to generate the height scan of FIG. 29A that shows contours of the (100) surface of the single crystalline beta phase silicon carbide layer and to generate the phase scan of FIG. 29B that shows changes in the height of the (100) surface, i.e., the presence of ledges in the (100) surface, after formation of the graphene layer FIG. 30A is an image from a height scan of the graphene layer formed on the (100) surface of the single crystalline beta phase silicon carbide layer of the sample over an area of 20 microns×20 microns as generated by the atomic force microscopy (AFM) probe. FIG. 30B is a corresponding phase scan of the graphene layer of the sample. Thus, the images in FIGS. 30A and 30B were generated after formation of the graphene layer, i.e., after graphitization. The images of FIGS. 30A and 30B were concurrently generated by the same scan of the AFM probe, but the data was subsequently processed to generate the height scan of FIG. 30A that shows contours of the graphene layer and to generate the phase scan of FIG. 30B that shows changes in the height of the graphene layer, i.e., the presence of ledges in the graphene layer.

Comparison of FIGS. 29A and 30A and comparison of FIGS. 29B and 30B show that there is not any substantial increase in surface roughness due to formation of the graphene layer in the sample. Thus, the graphene layer is not formed through a three-dimensional growth or agglomeration, but the graphene layer is formed as a planar layer on the entirety of the surface of the sample.

Further, sheet resistance of the graphene layer was measured employing a four-point probe on the sample. The measured values of the sheet resistance ranged from $1.24 \times 10^3$ Ohm/square to $2.75 \times 10^3$ Ohm/square. This shows that there is a macroscopic physical continuity in the graphene domains, i.e., the graphene layer is formed as a continuous sheet, not as disjoined patches or disjoined three-dimensional structures.

While the graphene layer was formed by graphitization instead of deposition of carbon atoms in this experiment, formation of a graphene layer directly on a sapphire surface describes above shows that a graphene layer can be formed by deposition instead of graphitization as shown in FIGS. 23 and 24. Because formation of the graphene layer by deposition is possible on the beta phase silicon carbide layer and because carbon atoms can be as effectively supplied by deposition of carbon as by graphitization to the top surface of the beta phase silicon carbide layer, the combination of experiments that produced the results of FIGS. 23 and 24 and the results of FIGS. 27A-30B collectively enable the structure of FIG. 26 through substitution of a graphitization process with a carbon deposition process.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a graphene layer on a sapphire substrate, said method comprising:
    forming a single crystalline semiconductor-carbon alloy layer on a sapphire substrate, wherein a (110) surface of a cubic crystal structure of said single crystalline semiconductor-carbon alloy layer is epitaxially aligned to a (1102) surface of said sapphire substrate; and
    forming a graphene layer directly on another (110) surface of said single crystalline semiconductor-carbon alloy layer.

2. The method of claim 1, wherein said graphene layer is formed by conversion of a top layer of said single crystalline semiconductor-carbon alloy layer.

3. The method of claim 2, wherein said conversion is effected by evaporating semiconductor atoms from said top layer at an elevated temperature from 800° C. to 2,000° C.

4. The method of claim 1, wherein said graphene layer is formed by deposition of carbon atoms that form said graphene layer on a top surface of said single crystalline semiconductor-carbon alloy layer.

5. The method of claim 4, wherein said graphene layer is formed by decomposition of a carbon-containing precursor at said top surface of said single crystalline semiconductor-carbon alloy layer.

6. The method of claim 1, wherein said single crystalline semiconductor-carbon alloy layer is a single crystalline silicon carbide layer having a hexagonal or cubic crystal structure.

\* \* \* \* \*